(12) United States Patent
Park et al.

(10) Patent No.: US 12,457,886 B2
(45) Date of Patent: Oct. 28, 2025

(54) DISPLAY DEVICE INCLUDING A TWO-DIMENSIONAL MATERIAL IN AN ENCAPSULATION LAYER AND METHOD OF MANUFACTURING THE SAME

(71) Applicants: Samsung Display Co., Ltd., Yongin-si (KR); Ajou University Industry-Academic Cooperation Foundation, Suwon-si (KR)

(72) Inventors: Dong Seop Park, Pyeongtaek-si (KR); Jae Hyun Lee, Suwon-si (KR); Sung Ho Cho, Yongin-si (KR)

(73) Assignees: Samsung Display Co., Ltd., Yongin-si (KR); Ajou University Industry-Academic Cooperation Foundation, Suwon-si (KR)

( * ) Notice: Subject to any disclaimer, the term of this patent is extended or adjusted under 35 U.S.C. 154(b) by 610 days.

(21) Appl. No.: 17/454,775

(22) Filed: Nov. 12, 2021

(65) Prior Publication Data

US 2022/0285658 A1 Sep. 8, 2022

(30) Foreign Application Priority Data

Mar. 4, 2021 (KR) .................. 10-2021-0028653

(51) Int. Cl.
*H10K 59/80* (2023.01)
*H10K 50/81* (2023.01)
(Continued)

(52) U.S. Cl.
CPC ......... *H10K 59/8731* (2023.02); *H10K 50/81* (2023.02); *H10K 50/844* (2023.02); *H10K 59/122* (2023.02); *H10K 71/00* (2023.02)

(58) Field of Classification Search
CPC ...... H10K 71/00; H10K 59/122; H10K 50/81; H10K 50/844; H10K 59/8731
(Continued)

(56) References Cited

U.S. PATENT DOCUMENTS 9,666,674 B2 5/2017 Dimitrakopoulos et al.
10,573,517 B2 * 2/2020 Berry ................ H01L 21/02502
(Continued)

FOREIGN PATENT DOCUMENTS

JP 2016-526251 9/2016
JP 2016-195174 11/2016
(Continued)

OTHER PUBLICATIONS

Velicky, Matej, et al. "Mechanism of Gold-Assisted Exfoliation of Centimeter-Sized Transition-Metal Dichalcogenide Monolayers," ACS Nano, vol. 12, pp. 10463-10472 (2018).
(Continued)

*Primary Examiner* — Eric W Jones
(74) *Attorney, Agent, or Firm* — Womble Bond Dickinson (US) LLP

(57) ABSTRACT

The display device comprises a substrate, a first electrode on the substrate, a pixel defining layer on the first electrode, the pixel defining layer exposing the first electrode, a light emitting layer on the first electrode exposed by the pixel defining layer, a second electrode on the light emitting layer, and an encapsulation layer on the second electrode, the encapsulation layer including a two-dimensional material. A slope of a 2D-peak position to a G-peak position of the two-dimensional material measured by Raman spectroscopy is within a range of 1.7 to 2.7.

13 Claims, 21 Drawing Sheets

(51) Int. Cl.
*H10K 50/844* (2023.01)
*H10K 59/122* (2023.01)
*H10K 71/00* (2023.01)

(58) Field of Classification Search
USPC .............................................. 257/40, 59, 72
See application file for complete search history.

(56) References Cited

U.S. PATENT DOCUMENTS

| | | | | |
|---|---|---|---|---|
| 2013/0092972 | A1* | 4/2013 | Kim | H10K 59/8731 438/26 |
| 2014/0234200 | A1* | 8/2014 | Tour | C01B 32/184 423/448 |
| 2014/0272350 | A1* | 9/2014 | Kim | C23C 16/26 427/430.1 |
| 2015/0303315 | A1* | 10/2015 | Das | H01L 29/24 438/151 |
| 2015/0337145 | A1* | 11/2015 | Torrisi | C09D 11/02 428/207 |
| 2016/0031711 | A1* | 2/2016 | Tour | C01B 32/184 428/408 |
| 2016/0197304 | A1* | 7/2016 | Kang | H10K 59/12 438/23 |
| 2016/0351629 | A1* | 12/2016 | Zhou | H01L 29/66742 |
| 2017/0110532 | A1* | 4/2017 | Kim | H10K 50/8445 |
| 2017/0346041 | A1* | 11/2017 | Kim | H10K 50/8445 |
| 2018/0315599 | A1* | 11/2018 | Berry | H01L 21/02491 |
| 2019/0139762 | A1* | 5/2019 | Berry | C01B 32/184 |
| 2020/0044194 | A1* | 2/2020 | Du | H01L 23/28 |
| 2021/0143366 | A1* | 5/2021 | Park | H10K 59/40 |
| 2022/0254641 | A1* | 8/2022 | Chua | C01B 32/186 |

FOREIGN PATENT DOCUMENTS

| | | |
|---|---|---|
| KR | 10-2011-0127363 A | 11/2011 |
| KR | 20130104071 A | 9/2013 |
| KR | 2016-0083992 | 7/2016 |
| KR | 10-2017-0021297 A | 2/2017 |
| KR | 20170106621 A | 9/2017 |
| KR | 2017-0121543 | 11/2017 |
| WO | WO 2018/009931 A1 | 1/2018 |
| WO | WO 2019/089793 A1 | 5/2019 |

OTHER PUBLICATIONS

Desai, Sujay B., et al. "Gold-Mediated Exfoliation of Ultralarge Optoelectronically-Perfect Monolayers," Advanced Materials, vol. 28, pp. 4053-4058 (2016).

Liu, Fang et al., "Disassembling 2D van der Waals crystals into macroscopic monolayers and reassembling into artificial lattices," Nanomaterials, Science, vol. 367, pp. 903-906 Feb. 21, 2020.

Office Action issued Nov. 19, 2024, by the Korean Intellectual Property Office for corresponding Korean Patent Application No. KR 10-2021-0028653, 9 pages.

* cited by examiner

DISPLAY DEVICE INCLUDING A TWO-DIMENSIONAL MATERIAL IN AN ENCAPSULATION LAYER AND METHOD OF MANUFACTURING THE SAME

CROSS-REFERENCE TO RELATED APPLICATION

This application claims priority to and the benefit of Korean Patent Application No. 10-2021-0028653 filed on Mar. 4, 2021 in the Korean Intellectual Property Office (KIPO), the entire content of which is incorporated by reference herein.

BACKGROUND

1. Field

The present disclosure relates to a display device and a method of manufacturing the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

As a display device, various types of display devices such as a liquid crystal display (LCD) device, an organic light emitting display (OLED) device and the like have been used. Among the display devices, the organic light emitting display device displays an image using an organic light emitting element that generates light by recombination of electrons and holes. The organic light emitting display device includes a plurality of transistors that provide a driving current to the organic light emitting element.

Recently, research on the use of two-dimensional materials for display devices has been actively conducted.

SUMMARY

Aspects of one or more embodiments of the present disclosure are directed toward a display device manufacturing method capable of controlling the number of layers of an exfoliated two-dimensional material, and a display device to which a two-dimensional material exfoliated by the manufacturing method is applied.

According to an embodiment of the present disclosure, the display device comprises a substrate, a first electrode on the substrate, a pixel defining layer on the first electrode, the pixel defining layer exposing the first electrode, a light emitting layer on the first electrode exposed by the pixel defining layer, a second electrode on the light emitting layer, and an encapsulation layer on the second electrode, the encapsulation layer including a two-dimensional material, wherein a slope of a 2D-peak position to a G-peak position of the two-dimensional material measured by Raman spectroscopy is within a range of 1.7 to 2.7.

In an embodiment, the 2D-peak position of the two-dimensional material measured by Raman spectroscopy is within a range of 2650 $cm^{-1}$ to 2675 $cm^{-1}$.

In an embodiment, the G-peak position of the two-dimensional material measured by Raman spectroscopy is within a range of 1575 $cm^{-1}$ to 1585.5 $cm^{-1}$.

In an embodiment, the encapsulation layer includes a first encapsulation layer, a second encapsulation layer, and a third encapsulation layer that are sequentially stacked, and at least one of the first encapsulation layer or the third encapsulation layer includes the two-dimensional material.

In an embodiment, the second encapsulation layer includes an organic material.

In an embodiment, the two-dimensional material of the encapsulation layer is graphene.

In an embodiment, the first electrode includes a two-dimensional material.

In an embodiment, the first electrode includes a first stacked conductive layer, a second stacked conductive layer, and a third stacked conductive layer that are sequentially stacked. The first stacked conductive layer and the third stacked conductive layer include the two-dimensional material of the first electrode.

In an embodiment, the two-dimensional material of the first electrode is graphene.

In an embodiment, the display device further comprises a thin film transistor electrically connected to the first electrode. A channel region of the thin film transistor includes a two-dimensional material.

In an embodiment, the two-dimensional material of the thin film transistor includes transition metal dichalogenides (TMDC).

According to an embodiment of the present disclosure, the display device comprises a substrate, a first electrode on the substrate, the first electrode including a two-dimensional material, a pixel defining layer on the first electrode, the pixel defining layer exposing the first electrode, a light emitting layer on the first electrode exposed by the pixel defining layer, a second electrode on the light emitting layer, and an encapsulation layer on the second electrode. A slope of a 2D-peak position to a G-peak position of the two-dimensional material measured by Raman spectroscopy is within a range of 1.7 to 2.7.

In an embodiment, the first electrode includes a first stacked conductive layer, a second stacked conductive layer, and a third stacked conductive layer that are sequentially stacked. The first stacked conductive layer and the third stacked conductive layer include the two-dimensional material of the first electrode.

In an embodiment, the two-dimensional material of the first electrode is graphene.

In an embodiment, the 2D-peak position of the two-dimensional material measured by Raman spectroscopy is within a range of 2650 $cm^{-1}$ to 2675 $cm^{-1}$.

According to an embodiment of the present disclosure, the method of manufacturing a display device, the method comprises preparing a two-dimensional material member including a multi-layer structure in which each layer includes a two-dimensional material, a metal layer on the two-dimensional material member, and a thermal release tape on the metal layer, and exfoliating at least one layer of the multi-layer structure of the two-dimensional material member utilizing the thermal release tape.

In an embodiment, a slope of a 2D-peak position to a G-peak position of the two-dimensional material exfoliated from the two-dimensional material member is within a range of 1.7 to 2.7. The G-peak position and the 2D-peak position are measured by Raman spectroscopy.

In an embodiment, when binding energy between the metal layer and an uppermost layer of the two-dimensional material member is 1 to 1.5 times bonding energy between each layer of the two-dimensional material member, the exfoliating of the at least one layer of the multi-layer structure of the two-dimensional material member comprises exfoliating only the uppermost layer of the two-dimensional material member.

In an embodiment, the method further comprises exfoliating at least one layer of the two-dimensional material from the two-dimensional material member from which at least a portion of the multi-layer structure is exfoliated.

In an embodiment, the metal layer includes at least one selected from gold (Au), palladium (Pd), nickel (Ni), and cobalt (Co).

However, aspects of the present disclosure are not limited to any aspects set forth herein. The above and other aspects of the present disclosure will become more apparent to one of ordinary skill in the art to which the present disclosure pertains by referencing the detailed description of the present disclosure given below.

In accordance with a display device and a display device manufacturing method according to one or more embodiments, it is possible to control the number of layers of an exfoliated two-dimensional material and to reduce the cost of a display device manufacturing process.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in more detail embodiments thereof with reference to the attached drawings, in which.

DETAILED DESCRIPTION

Figure 1:
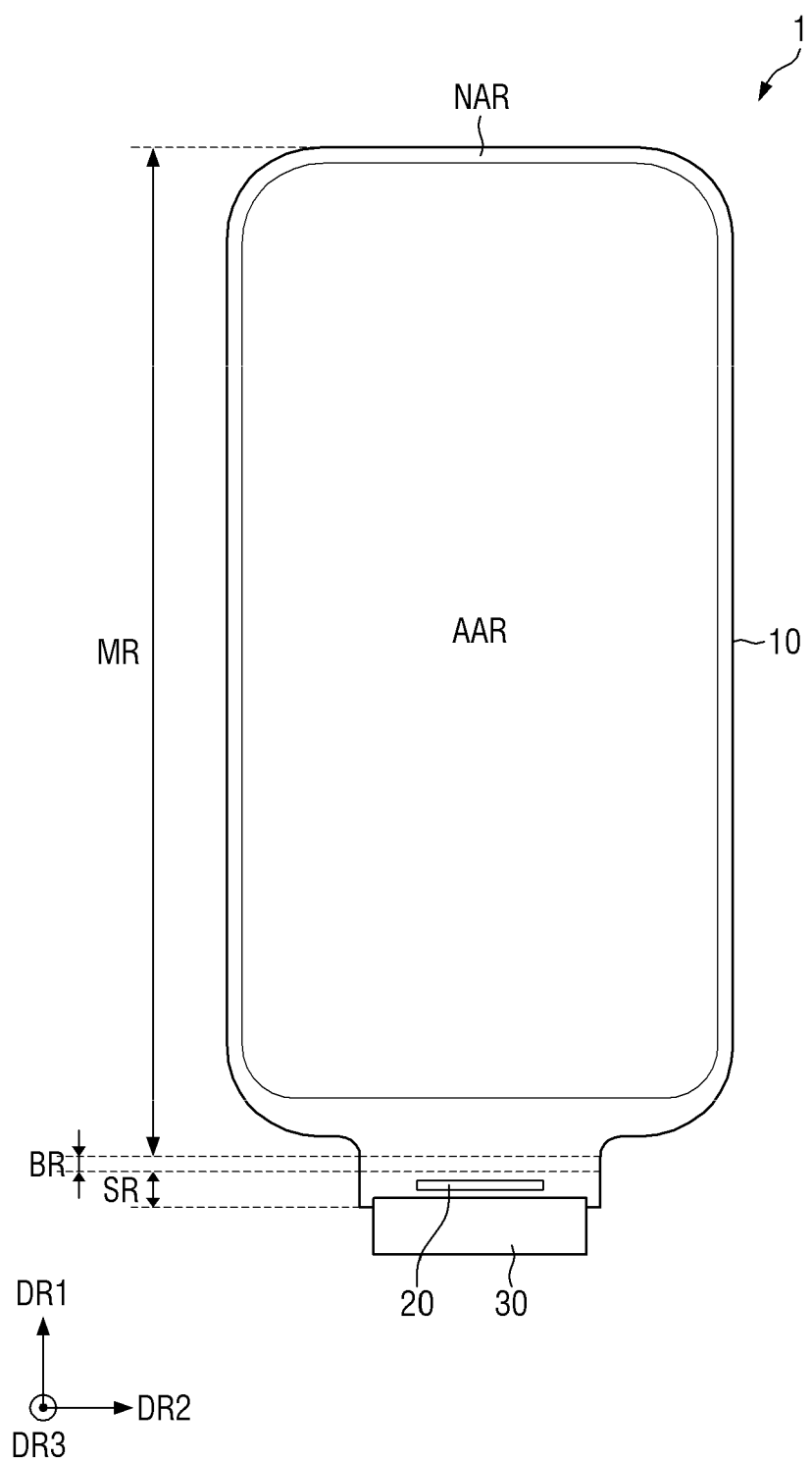
FIG. 1 is a plan view of a display device according to one or more embodiments.

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification, and duplicative descriptions thereof may not be provided.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described in more detail with reference to the accompanying drawings.

Figure 2:
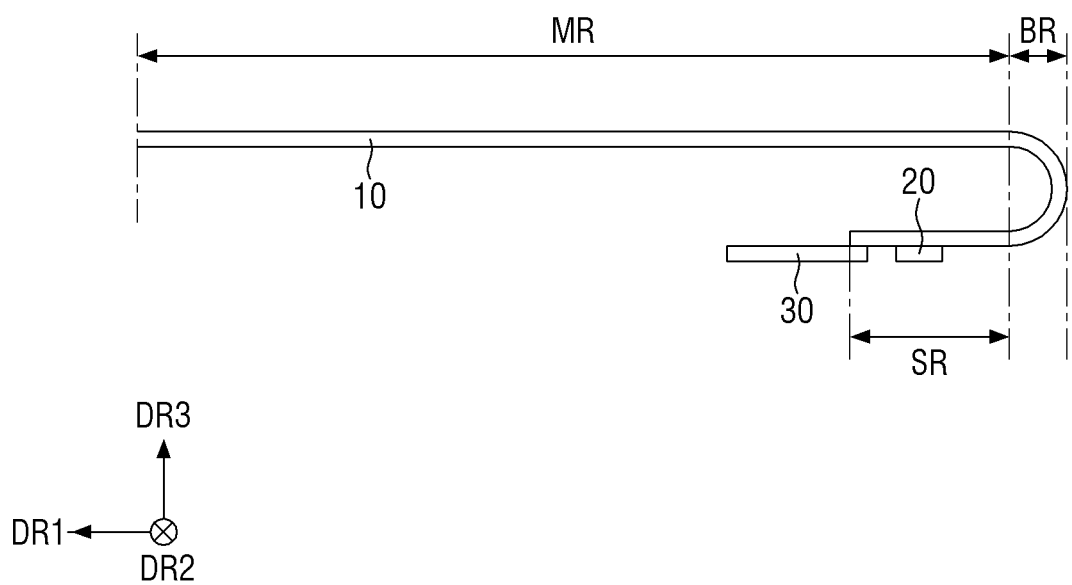
FIG. 2 is a schematic partial cross-sectional view of a display device according to one or more embodiments.

FIG. 1 is a plan view of a display device according to one or more embodiments. FIG. 2 is a schematic partial cross-sectional view of a display device according to one or more embodiments.

In one or more embodiments, a first direction DR1 and a second direction DR2 are different directions that cross each other. In the plan view of FIG. 1, the vertical direction is defined as the first direction DR1 and the horizontal direction is defined as the second direction DR2 for convenience of explanation. In the following embodiments, one side of the first direction DR1 represents an upward direction in a plan view, and the other side of the first direction DR1 represents a downward direction in a plan view. One side of the second direction DR2 represents a rightward direction in a plan view, and the other side of the second direction DR2 represents a leftward direction in a plan view.

A third direction DR3 is a direction intersecting a plane defined by or parallel to the first direction DR1 and the second direction DR2, and the third direction DR3 perpendicularly intersects both the first direction DR1 and the second direction DR2. It should be understood, however, that directions mentioned in one or more embodiments refer to relative directions and the one or more embodiments are not limited to the directions mentioned.

Unless otherwise defined, with respect to the third direction DR3, the terms "above," "top surface," and "upper side" as used herein refer to a display surface or a display surface side of a display panel 10, and the terms "below," "bottom surface," and "lower side" as used herein refer to a side or a surface opposite the display surface or the display surface side of the display panel 10.

Referring to FIGS. 1 and 2, a display device 1 may refer to any electronic device providing a display screen. Examples of the display device 1 may include a television, a laptop computer, a monitor, a billboard, an Internet-of-Things device and/or the like. Additional examples of the display device 1 may include portable electronic devices, which provide a display screen, such as a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine, a digital camera and/or the like.

The display device 1 includes an active region AAR and a non-active region NAR. In the display device 1, an area including a display screen (e.g., an area where an image may be displayed) may be defined as a display area, an area not including a display screen (e.g., an area where an image is not displayed) may be defined as a non-display area, and an area where a touch input may be detected may be defined as a touch area. In one or more embodiments, the display area and the touch area may be included in the active region AAR. The display area and the touch area may overlap each other. Therefore, the active region AAR may be a region where an image may be displayed and the touch input may be detected.

The active region AAR may have a rectangular shape with sharp or right-angled corners or a rectangular shape with rounded or curved corners. The illustrated active region AAR has a rectangular shape with rounded corners and in which a side of the active region AAR in the first direction DR1 is longer than a side of the active region AAR in the second direction DR2. However, the active region AAR is not limited thereto, and may have various suitable shapes and dimensions. For example, the active region AAR may have a rectangular shape whose side in the second direction DR2 is longer than a side in the first direction DR1, a square shape, or a polygonal shape such as a circular shape, an elliptical shape, or the like.

The non-active region NAR is disposed around the active region AAR. The non-active region NAR may be a bezel area. The non-active region NAR may surround all sides (i.e., four sides in FIG. 1) of the active region AAR. However, the present disclosure is not limited thereto, and, for example, the non-active region NAR may not be disposed near the upper side of the active region AAR or near the right and left sides of the active region AAR.

In the non-active region NAR, signal wires or driving circuits for applying a signal to the active region AAR (e.g., the display area and/or the touch area) may be disposed. The non-active region NAR may not include the display area.

Furthermore, the non-active region NAR may not include the touch area. In another embodiment, the non-active region NAR may include a portion of the touch area, and a sensor member such as a pressure sensor and/or the like may be disposed in that region. In some embodiments, the active region AAR may completely coincide with the display area where a display screen is present (e.g., an area where an image may be displayed), and the non-active region NAR may completely coincide with the non-display area where a display screen is not present (e.g., an area where an image is not displayed).

The display device 1 includes a display panel 10 that provides a display screen. Examples of the display panel 10 may include an organic light emitting display panel, a micro LED display panel, a nano LED display panel, a quantum dot light emitting display panel, a liquid crystal display panel, a plasma display panel, a field emission display panel, an electrophoretic display panel, an electrowetting display panel, and/or the like. In the following description, a case where an organic light emitting display panel is applied as an example of the display panel 10 may be described, but the present disclosure is not limited thereto, and other display panels may be applied within the spirit and scope of the present disclosure.

The display panel 10 may include a plurality of pixels. The plurality of pixels may be arranged in a matrix. The shape of each pixel may be a rectangular shape or a square shape in a plan view. However, the present disclosure is not limited thereto, and the shape of each pixel may be a rhombic shape in which each side is inclined with respect to the first direction DR1 or the second direction DR2. Each pixel may include an emission area. The shape of each emission area may be the same as or different from the shape of the pixel. For example, when a pixel has a rectangular shape, the emission area of the pixel may have various suitable shapes such as a rectangular shape, a rhombic shape, a hexagonal shape, an octagonal shape, a circular shape, and/or the like. Each pixel and each emission area may be described in more detail later.

The display device 1 may further include a touch member for detecting a touch input. The touch member may be provided as a panel or film separate from the display panel 10 and attached onto the display panel 10, but may also be provided in the form of a touch layer inside the display panel 10. In the following embodiments, the case where the touch member is provided inside the touch panel and included in the form of a touch layer in the display panel 10 is illustrated, but the present disclosure is not limited thereto.

The display panel 10 may include a flexible substrate including a flexible polymer material such as polyimide. Accordingly, the display panel 10 can be curved, bent, folded or rolled.

The display panel 10 may include a bending region BR, which is a region in which the panel is bent. The display panel 10 may be divided into a main region MR located at one side of the bending region BR and a sub-region SR located at the other side of the bending region BR.

The display area of the display panel 10 is disposed in the main region MR. In one or more embodiments, a peripheral edge portion around the display area in the main region MR, the entire bending region BR, and the entire sub-region SR may be at the non-display area. However, the present disclosure is not limited thereto, and the bending region BR and/or the sub-region SR may also include or be at the display area in one or more other embodiments.

The main region MR may have a shape substantially similar to an outer shape of the display device 1 in a plan view. The main region MR may be a flat region located on one plane. However, the present disclosure is not limited thereto, and at least one edge of the remaining edges except an edge (side) of the main region MR connected to the bending region BR may be bent in a curved shape or bent in a vertical direction.

If at least one of the edges other than the edge of the main region MR connected to the bending region BR is curved or bent, the display area may also be disposed on the corresponding edge. However, the present disclosure is not limited thereto, and the non-display area that does not display a screen may be disposed on the curved or bent edge. Alternatively, both the display area and the non-display area may be disposed thereon.

The bending region BR is connected to the other side of the main region MR in the first direction DR1. For example, the bending region BR may be connected to the main region MR through a lower short side of the main region MR. The width (e.g., width in the second direction DR2) of the bending region BR may be smaller than the width (e.g., width of the short side) of the main region MR. A connection portion between the main region MR and the bending region BR may have an L-shaped cut portion.

In the bending region BR, the display panel 10 may be bent with a curvature downward in a thickness direction (i.e., the third direction DR3 or a direction perpendicular to a display surface) of the display device 1. The bending region BR may have a constant radius of curvature. However, the present disclosure is not limited thereto, and the bending region BR may have a different radius of curvature for each section. The surface of the display panel 10 may be reversed as the display panel 10 is bent in the bending region BR. In other words, one surface of the display panel 10 facing upward may be changed to face outward through the bending region BR and then to face downward.

The sub-region SR extends from the bending region BR. The sub-region SR may extend in a direction parallel to the main region MR from a point where bending is completed. The sub-region SR may overlap the main region MR in the thickness direction of the display panel 10. The width of the sub-region SR (e.g., width in the second direction DR2) may be the same as the width (e.g., width in the second direction DR2) of the bending region BR, but the present disclosure is not limited thereto.

A driving chip 20 may be disposed in the sub-region SR. The driving chip 20 may include an integrated circuit for driving the display panel 10. The integrated circuit may include a display integrated circuit and/or a touch unit integrated circuit. The display integrated circuit and the touch unit integrated circuit may be provided as separate chips (e.g., a plurality of chips) or may be provided as one integrated chip.

A pad portion may be disposed at an end portion of the sub-region SR of the display panel 10. The pad portion may include a plurality of display signal wiring pads and touch signal wiring pads. A driving substrate 30 may be connected to the pad portion of the end portion of the sub-region SR of the display panel 10. The driving substrate 30 may be a flexible printed circuit board or film.

Figure 3:
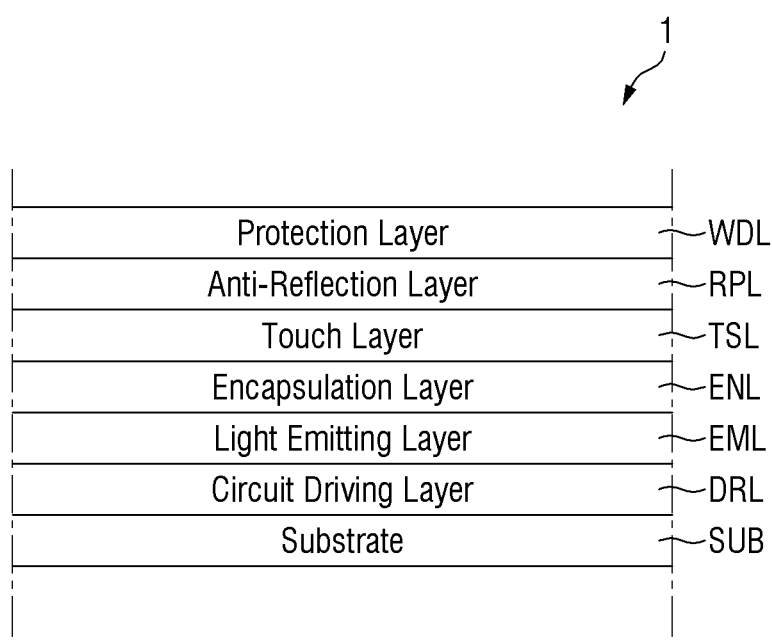
FIG. 3 is a schematic cross-sectional view showing an stacked structure of a display device according to one or more embodiments.

FIG. 3 is a schematic cross-sectional view showing a stacked structure of a display device according to one or more embodiments.

Referring to FIG. 3, the display device 1 may include a substrate SUB, a circuit driving layer DRL, a light emitting layer EML, an encapsulation layer ENL, a touch layer TSL, an anti-reflection layer RPL, and a protection layer WDL that are sequentially stacked.

The substrate SUB may support the components disposed thereon.

The circuit driving layer DRL may be disposed on the substrate SUB. The circuit driving layer DRL may include a circuit that drives the light emitting layer EML of the pixel. The circuit driving layer DRL may include a plurality of thin film transistors.

The light emitting layer EML may be disposed on the circuit driving layer DRL. The light emitting layer EML may include an organic light emitting layer. The light emitting layer EML may emit light with various suitable luminance levels according to a driving signal transmitted from the circuit driving layer DRL.

The encapsulation layer ENL may be disposed on the light emitting layer EML. The encapsulation layer ENL may include an inorganic layer or a stack of an inorganic layer and an organic layer. As another example, the encapsulation layer ENL may be implemented with a glass or an encapsulation film.

The touch layer TSL may be disposed on the encapsulation layer ENL. The touch layer TSL is a layer for recognizing a touch input, and may function as a touch member. The touch layer TSL may include a plurality of sensing areas and sensing electrodes.

When the touch layer TSL is included in the display panel 10 (e.g., see FIG. 1), the display panel 10 (e.g., see FIG. 1) may include the substrate SUB, the circuit driving layer DRL, the light emitting layer EML, the encapsulation layer ENL, and the touch layer TSL. However, the present disclosure is not limited thereto.

The anti-reflection layer RPL may be disposed on the touch layer TSL. The anti-reflection layer RPL may serve to reduce the reflection of external light. The anti-reflection layer RPL may be attached in the form of a polarizing film. In this case, the anti-reflection layer RPL may polarize light passing therethrough, and the anti-reflection layer RPL may be attached onto the touch layer TSL via an adhesive layer. The anti-reflection layer RPL in the form of a polarizing film may be omitted. The anti-reflection layer RPL may serve to reduce the reflection of external light. However, the present disclosure is not limited thereto, and the anti-reflection layer RPL may be stacked in the form of a color filter layer inside the display panel 10. In this case, the anti-reflection layer RPL may include a color filter for selectively transmitting light of a specific wavelength, and/or the like.

The protection layer WDL may be disposed on the anti-reflection layer RPL. The protection layer WDL may include, for example, a window or a window member. The protection layer WDL may be attached onto the anti-reflection layer RPL by an optically clear adhesive and/or the like.

Hereinafter, the stacked structure of the display panel 10 will be described.

Figure 4:
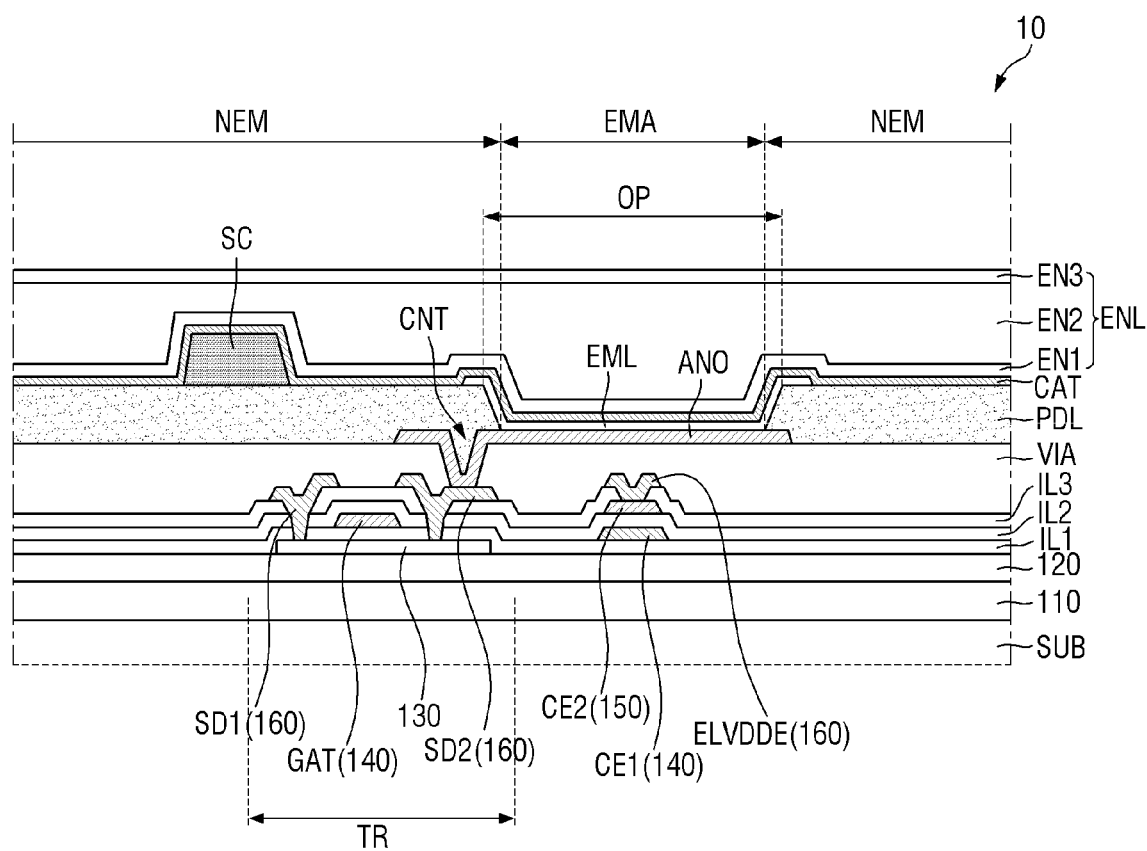
FIG. 4 is a cross-sectional view of a display panel according to one or more embodiments.

FIG. 4 is a cross-sectional view of a display panel according to one or more embodiments.

Referring to FIG. 4, the display panel 10 according to one or more embodiments may include a plurality of pixels, and each pixel may include at least one thin film transistor TR. The display panel 10 may include the substrate SUB, a barrier layer 110, a buffer layer 120, an active layer 130, a first insulating layer IL1, a first gate conductive layer 140, a second insulating layer IL2, a second gate conductive layer 150, a third insulating layer IL3, a data conductive layer 160, a via layer VIA, an anode electrode ANO, a pixel defining layer PDL including a first pixel defining layer through-hole OP that exposes the anode electrode ANO, a spacer SC disposed on the pixel defining layer PDL, the light emitting layer EML disposed in the first pixel defining layer through-hole OP of the pixel defining layer PDL, a cathode electrode CAT disposed on the light emitting layer EML and the pixel defining layer PDL, and the encapsulation layer ENL disposed on the cathode electrode CAT. Each of the layers described above may consist of a single layer or a stack of multiple layers. Other layers may be further disposed between the layers.

The substrate SUB supports the respective layers disposed thereon. The substrate SUB may be made of an insulating material such as a polymer resin, and/or may be made of an inorganic material such as glass, quartz, and/or the like. However, the present disclosure is not limited thereto, and the substrate SUB may be a transparent plate or a transparent film.

The substrate SUB may be a flexible substrate which can be bent, folded, or rolled, but is not limited thereto, and the substrate SUB may be a rigid substrate.

The barrier layer 110 is disposed on the substrate SUB. The barrier layer 110 may prevent or reduce diffusion of impurity ions, prevent or reduce permeation of moisture or external air, and perform a surface planarization function. The barrier layer 110 may include at least one of silicon oxide ($SiO_x$), silicon nitride ($SiN_x$), or silicon oxynitride ($SiO_xN_y$). However, the present disclosure is not limited thereto, and the barrier layer 110 may be omitted depending on the type of the substrate SUB, processing conditions, or the like.

The buffer layer 120 is disposed on the barrier layer 110. The buffer layer 120 can prevent or reduce diffusion of impurity ions, prevent or reduce penetration of moisture or external air, and perform a surface planarization function. For example, the buffer layer 120 may have a flat or substantially flat top surface. The buffer layer 120 may include silicon nitride ($SiN_x$), silicon oxide ($SiO_x$), silicon oxynitride ($SiO_xN_y$), or the like. The buffer layer 120 may be omitted depending on the type of the substrate SUB, processing conditions, and/or the like.

The active layer 130 is disposed on the buffer layer 120. The active layer 130 forms the channel of the thin film transistor TR of the pixel. The active layer 130 may include polycrystalline silicon. However, without being limited thereto, the active layer 130 may include at least one of monocrystalline silicon, low-temperature polycrystalline silicon, or amorphous silicon.

Alternatively, the active layer 130 may include an oxide semiconductor. For example, the oxide semiconductor may include at least one of indium-gallium-zinc oxide (IGZO), zinc-tin oxide (ZTO), or indium-tin oxide (ITO).

The first insulating layer IL1 is disposed on the active layer 130. The first insulating layer IL1 may be a gate insulating layer having a gate insulating function. The first insulating layer IL1 may include at least one of a silicon compound or a metal oxide.

The first gate conductive layer 140 is disposed on the first insulating layer IL1. The first gate conductive layer 140 may include a gate electrode GAT of the thin film transistor TR of the pixel, a scan line connected thereto, and a first electrode CE1 of a storage capacitor.

The first gate conductive layer 140 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second insulating layer IL2 may be disposed on the first gate conductive layer 140. The second insulating layer IL2 may be an interlayer insulating layer or a second gate insulating layer. The second insulating layer IL2 may include an inorganic insulating material such as silicon oxide, silicon nitride, silicon oxynitride, hafnium oxide, aluminum oxide, titanium oxide, tantalum oxide, zinc oxide and/or the like.

The second gate conductive layer 150 is disposed on the second insulating layer IL2. The second gate conductive layer 150 may include a second electrode CE2 of the storage capacitor. The second gate conductive layer 150 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second gate conductive layer 150 may be made of the same material as the first gate conductive layer 140, but is not limited thereto. For example, the second gate conductive layer 150 and the first gate conductive layer 140 may be made of different materials from each other.

The third insulating layer IL3 is disposed on the second gate conductive layer 150. The third insulating layer IL3 may be an interlayer insulating layer. The third insulating layer IL3 may include an inorganic insulating material such as silicon oxide, silicon nitride, silicon oxynitride, hafnium oxide, aluminum oxide, titanium oxide, tantalum oxide, zinc oxide and/or the like.

The data conductive layer 160 is disposed on the third insulating layer IL3. The data conductive layer 160 may include a first electrode SD1 and a second electrode SD2 of the thin film transistor TR of one pixel of a display panel, and a first power voltage electrode ELVDDE. The first electrode SD1 and the second electrode SD2 of the thin film transistor TR may be electrically connected to a source region and a drain region of the active layer 130 via contact holes passing through the third insulating layer IL3, the second insulating layer IL2 and the first insulating layer IL1. The first power voltage electrode ELVDDE may be electrically connected to the second electrode CE2 of the storage capacitor through a contact hole penetrating the third insulating layer IL3.

The data conductive layer 160 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The data conductive layer 160 may be a single layer or a multilayer. For example, the data conductive layer 160 may have a stacked structure of Ti/Al/Ti, Mo/Al/Mo, Mo/AlGe/Mo, or Ti/Cu.

The via layer VIA (or planarization layer) is disposed on the data conductive layer 160. The via layer VIA covers the data conductive layer 160. The via layer VIA may be a planarization layer. The via layer VIA may include an organic insulating material. When the via layer VIA contains an organic material, the via layer VIA may have a substantially flat top surface although a stepped portion is formed at a lower portion thereof.

The anode electrode ANO is disposed on the via layer VIA. The anode electrode ANO may be disposed on one surface of the via layer VIA. The anode electrode ANO may be a pixel electrode provided for each pixel. The anode electrode ANO may be connected to the second electrode SD2 of the thin film transistor TR through a contact hole CNT penetrating the via layer VIA. The anode electrode ANO may at least partially overlap the emission area EMA of the pixel.

The anode electrode ANO may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a mixture thereof, but is not limited thereto. The layer having a high work function may be disposed above the reflective material layer and disposed closer to the light emitting layer EML. The anode electrode ANO may have a multilayer structure such as ITO/Mg, ITO/MgF, ITO/Ag and ITO/Ag/ITO, but is not limited thereto.

The pixel defining layer PDL may be disposed on the anode electrode ANO. The pixel defining layer PDL may include the first pixel defining layer through-hole OP that is disposed on the anode ANO and exposes the anode electrode ANO. The first pixel defining layer through-hole OP may be defined by the pixel defining layer PDL and penetrate the pixel defining layer PDL in the thickness direction. The emission area EMA and the non-emission area NEM may be distinguished by the pixel defining layer PDL and the first pixel defining layer through-hole OP thereof. The pixel defining layer PDL may include an organic insulating material. However, the present disclosure is not limited thereto, and the pixel defining layer PDL may include an inorganic material.

The spacer SC may be disposed on the pixel defining layer PDL. The spacer SC may protrude from at least a portion of the pixel defining layer PDL toward one side (e.g., an upper side of the display panel 10) in the thickness direction. The spacer SC may serve to maintain a gap with a structure disposed thereon. Although not limited to the following, for example, the spacer SC may prevent or reduce defects such as scratching and the like on the display panel 10 by a fine metal mask (FMM). The spacer SC may include an organic insulating material, similar to the pixel defining layer PDL. Although not limited to the following, both the spacer SC and the pixel defining layer PDL may be formed by the same process.

The light emitting layer EML is disposed on the anode electrode ANO exposed by the pixel defining layer PDL. The light emitting layer EML may include an organic material layer. The organic material layer of the light emitting layer may include an organic light emitting layer, and may further include a hole injection/transport layer and/or an electron injection/transport layer.

The cathode electrode CAT may be disposed on the light emitting layer EML. In one or more embodiments, the cathode electrode CAT may be a common electrode extending across all the pixels. The anode electrode ANO, the light emitting layer EML, and the cathode electrode CAT may constitute an organic light emitting element.

The cathode electrode CAT may include a material layer having a low work function, such as Li, Ca, LiF/Ca, LiF/Al, Al, Mg, Ag, Pt, Pd, Ni, Au, Nd, Ir, Cr, BaF, Ba or a compound or mixture thereof (e.g., a mixture of Ag and Mg). The cathode electrode CAT may further include a transparent metal oxide layer disposed on the material layer having a low work function.

The encapsulation layer ENL including a first encapsulation layer EN1, a second encapsulation layer EN2, and a third encapsulation layer EN3 is disposed on the cathode electrode CAT. The first encapsulation layer EN1 and the third encapsulation layer EN3 may be in contact with each other at the end portion of the encapsulation layer ENL. The second encapsulation layer EN2 may be sealed by the first encapsulation layer EN1 and the third encapsulation layer EN3. In one or more embodiments, the second encapsulation layer EN2 may be sealed between the first encapsulation layer EN1 and the third encapsulation layer EN3.

At least one of the first encapsulation layer EN1 or the third encapsulation layer EN3 may include a two-dimensional material. Although not limited to the following, the two-dimensional material may include at least one selected from, for example, graphene, transition metal dichalcogenides (TMDC), hexagonal boron nirtide (hBN), borophene (BP), and/or the like.

The two-dimensional material may include one or more layers, and one or more layers may be made of the same material. When the two-dimensional material includes two or more layers, two or more layers may be coupled to each other by Van der Waals interaction (e.g., Van der Waals forces). Although graphene is described as the two-dimensional material included in at least one of the first encapsulation layer EN1 or the third encapsulation layer EN3 of the display device according to one or more embodiments, the present disclosure is not limited thereto.

When the third encapsulation layer EN3 includes graphene and the touch layer TSL (e.g., see FIG. 3) is disposed on the encapsulation layer ENL, an insulating layer including an insulating material may be disposed between the third encapsulation layer EN3 and the touch layer TSL. In other words, another insulating layer may be disposed between the third encapsulation layer EN3 including graphene and the touch conductive layer of the touch layer TSL. The insulating layer may include at least one of an inorganic insulating material or an organic insulating material. Accordingly, although the third encapsulation layer EN3 includes graphene, the touch driving of the touch layer TSL may operate normally.

The second encapsulation layer EN2 may include an organic material. Although not limited to the following, the organic material may include, for example, an organic insulating material. Further, when only one of the first encapsulation layer EN1 and the third encapsulation layer EN3 includes a two-dimensional material, the other one may include an inorganic material. Although not limited to the following, the inorganic material may include, for example, silicon nitride, silicon oxide, silicon oxynitride, and/or the like.

Figure 5:
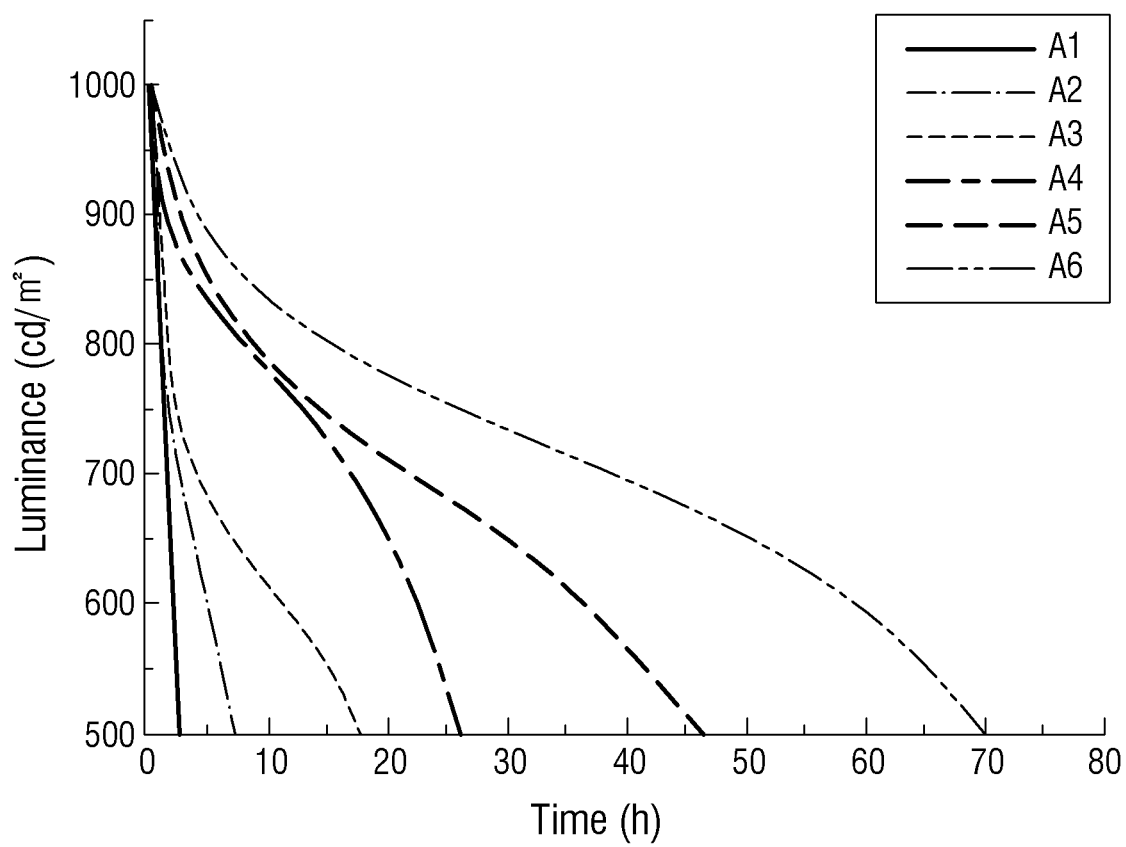
FIG. 5 is a graph showing luminance of an organic light emitting element with respect to time.

FIG. 5 is a graph showing luminance of an organic light emitting element with respect to time.

In FIG. 5, the horizontal axis (X-axis) represents time, and the vertical axis (Y-axis) represents luminance of an organic light emitting element. In FIG. 5, A1 indicates the case where the organic light emitting element is exposed to air without another encapsulation layer thereon, A2 indicates the case where polyethylene terephthalate (PET) is disposed on the organic light emitting element, A3 indicates the case where polyethylene terephthalate (PET) and polydimethylsiloxane (PDMS) are arranged on the organic light emitting element, A4 indicates the case where polyethylene terephthalate (PET), polydimethylsiloxane (PDMS), and two layers of graphene are arranged on the organic light emitting element, A5 indicates the case where polyethylene terephthalate (PET), polydimethylsiloxane (PDMS), and four layers of graphene are arranged on the organic light emitting element, and A6 indicates the case where polyethylene terephthalate (PET), polydimethylsiloxane (PDMS), and six layers of graphene are arranged on the organic light emitting element.

Referring to FIGS. 4 and 5, in the case of A1, about 3 hours elapse before the luminance of the organic light emitting element becomes "0". In the case of A2, about 7 hours elapse before the luminance of the organic light emitting element becomes "0". In the case of A3, about 17 hours elapse before the luminance of the organic light emitting element becomes "0". In the case of A4, about 26 hours elapse before the luminance of the organic light emitting element becomes "0". In the case of A5, about 47 hours elapse before the luminance of the organic light emitting element becomes "0". In the case of A6, about 70 hours elapse before the luminance of the organic light emitting element becomes "0".

In other words, in all the cases of A1 to A6 in FIG. 5, the luminance tends to decrease as time elapses. However, when another material is disposed on the organic light emitting element (e.g., see cases A2 to A6 in FIG. 5), the luminance decreases at a lower rate and the luminance of the organic light emitting element is maintained for a longer time compared to when the organic light emitting element is exposed to air (e.g., see case A1 in FIG. 5). When graphene is disposed on the organic light emitting element (e.g., see cases A4 to A6 in FIG. 5), the rate at which the luminance of the organic light emitting element decreases is reduced and the luminance of the organic light emitting element is maintained for a longer time compared to when no graphene is disposed (e.g., see cases A1 to A3 in FIG. 5). Further, as the number of layers of graphene arranged on the organic light emitting element increases, the rate at which the luminance of the organic light emitting element decreases is further reduced, and the luminance of the organic light emitting element is maintained for a longer time.

That is, when graphene is disposed on the organic light emitting element, it is possible to suppress, reduce, or prevent deterioration of the light emitting layer EML of the organic light emitting element, and also possible to increase the period of time in which the luminance of the organic light emitting element is maintained.

Figure 6:
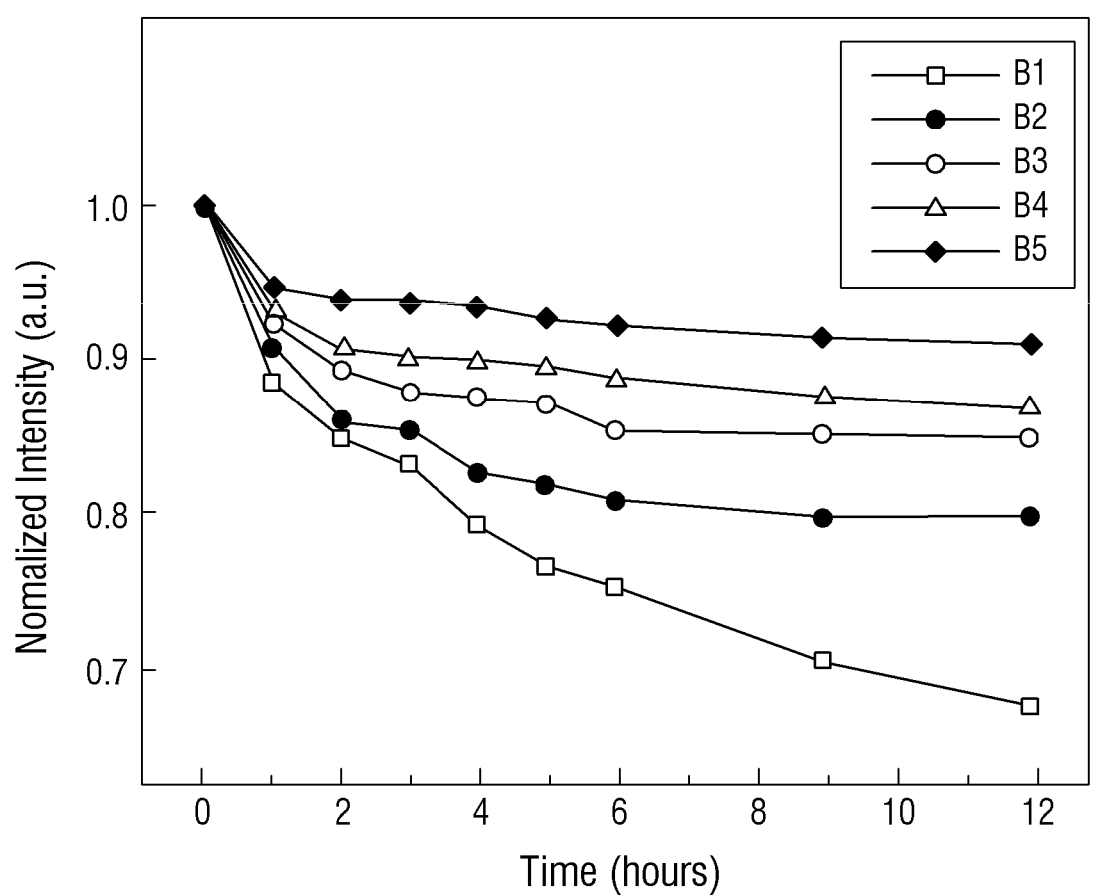
FIG. 6 is a graph showing a degree of deterioration of an organic light emitting element with respect to time.

FIG. 6 is a graph showing a degree of deterioration of an organic light emitting element with respect to time.

In FIG. 6, the horizontal axis (X-axis) represents time, and the vertical axis (Y-axis) represents a normalized intensity of light emitted by an organic light emitting element. That is, the normalized intensity indicates the intensity of the emitted light with respect to time in a state where the intensity of initially emitted light is set to 1. In FIG. 6, B1 indicates the case where the organic light emitting element is exposed to air without another encapsulation layer thereon, B2 indicates the case where a single layer of graphene is disposed on the organic light emitting element, B3 indicates the case where two layers of graphene are arranged on the organic light emitting element, B4 indicates the case where three layers of graphene are arranged on the organic light emitting element, and B5 indicates the case where four layers of graphene are arranged on the organic light emitting element.

Referring further to FIGS. 4 and 6, in the case of B1 to B5, the normalized light density decreases from "1" as time elapses. After 12 hours, the normalized light intensity is about 0.67 in the case of B1, about 0.8 in the case of B2, about 0.85 in the case of B3, about 0.88 in the case of B4, and about 0.92 in the case of B5.

In other words, the rate of decrease in the intensity of light emitted by the organic light emitting element is lower when graphene is disposed on the organic light emitting element (e.g., see cases B2 to B5 in FIG. 6) than when no graphene is disposed on the organic light emitting element (e.g., see case B1 in FIG. 6). That is, it is possible to suppress, reduce, or prevent the phenomenon of deterioration of the organic light emitting element by providing graphene on the organic light emitting element. Further, as the number of layers of graphene arranged on the organic light emitting element increases, the rate of decrease in the density of the light emitted by the light emitting element decreases. In other words, as the number of layers of graphene arranged on the organic light emitting element increases, the degree of deterioration of the organic light emitting element may decrease.

That is, when graphene is disposed on the organic light emitting element, it is possible to suppress, reduce, or prevent the deterioration of the organic light emitting element, and the deterioration of the organic light emitting element may decrease as the number of layers of graphene arranged on the organic light emitting element increases.

Referring back to FIG. 4, when at least one of the first encapsulation layer EN1 and the third encapsulation layer EN3 includes graphene, the graphene may have a constant strain that may be measured by Raman spectroscopy.

Figure 7:
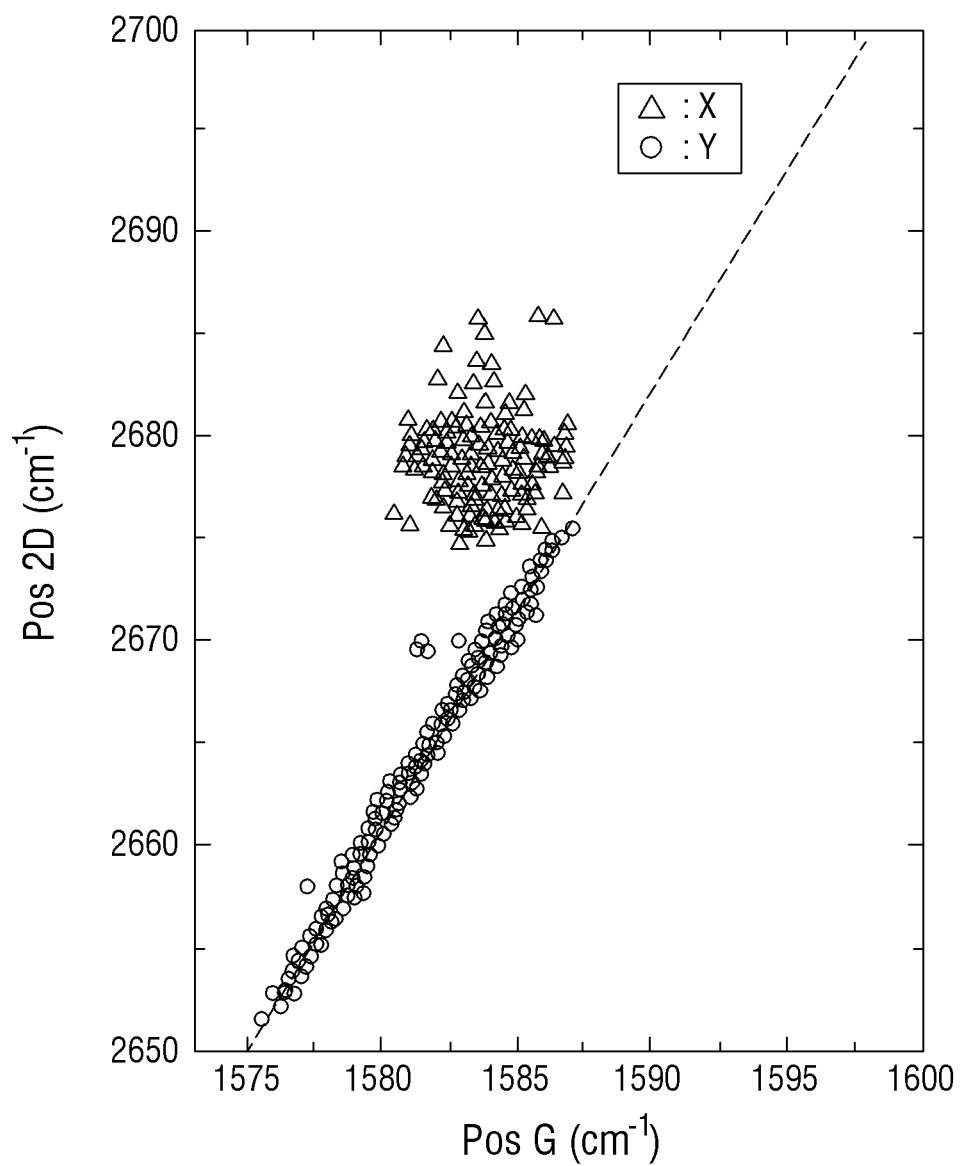
FIG. 7 is a graph showing a G-peak position and a 2D-peak position measured by Raman spectroscopy.

FIG. 7 is a graph showing a G-peak position and a 2D-peak position measured by Raman spectroscopy. In FIG. 7, the horizontal axis represents a G-peak position and the vertical axis represents a 2D-peak position. The G-peak may indicate a peak commonly found in graphite-based materials. The G-peak may be caused in a mode in which neighboring carbon atoms move in opposite directions. The 2D-peak may indicate the thickness of graphene.

In FIG. 7, X indicates the G-peak position and the 2D-peak position measured in graphene in a natural state, and Y indicates the G-peak position and the 2D-peak position measured in each layer of graphene included in at least one of the first to third encapsulation layers EN1 to EN3 of the display device according to one or more embodiments of the present disclosure. Y may be, but not necessarily be, obtained in the case of exfoliating a two-dimensional material using gold (Au) in the display device manufacturing method including a method of exfoliating a two-dimensional material to be described later. The method of exfoliating a two-dimensional material may be described in more detail later.

Referring to FIGS. 4 and 7, in the case of X, the measured G-peak position is within the range of about 1580 cm$^{-1}$ to about 1585.5 cm$^{-1}$, and the measured 2D-peak position is within the range of about 2674 cm$^{-1}$ to 2687 cm$^{-1}$. Further, in the case of X, the 2D-peak position with respect to the G-peak position has no tendency.

In the case of Y, the G-peak position is within the range of about 1575 cm$^{-1}$ to about 1585.5 cm$^{-1}$ or within the range of about 1575 cm$^{-1}$ to about 1580 cm$^{-1}$, and the measured 2D-peak position is within the range of about 2650 cm$^{-1}$ to about 2675 cm$^{-1}$. The size of the measured 2D-peak position tends to increase as the size of the measured G-peak position increases. The 2D-peak position with respect to the G-peak position measured by Raman spectroscopy may be aligned in accordance with an inclination or a slope. In other words, the 2D-peak position with respect to the G-peak position measured by Raman spectroscopy may be located on a straight line having an inclination or a slope. Although not limited to the following, the inclination or the slope may be within the range of 1.2 to 3.2, or within the range of 1.7 to 2.7, or within the range of 1.8 to 2.3, or within the range of 2.1 to 2.3, or may have a value of 2.2.

Hereinafter, a method of manufacturing a display device according to one or more embodiments will be described.

FIGS. 8-12 are side views illustrating a method of manufacturing a display device according to one or more embodiments.

Figure 8:
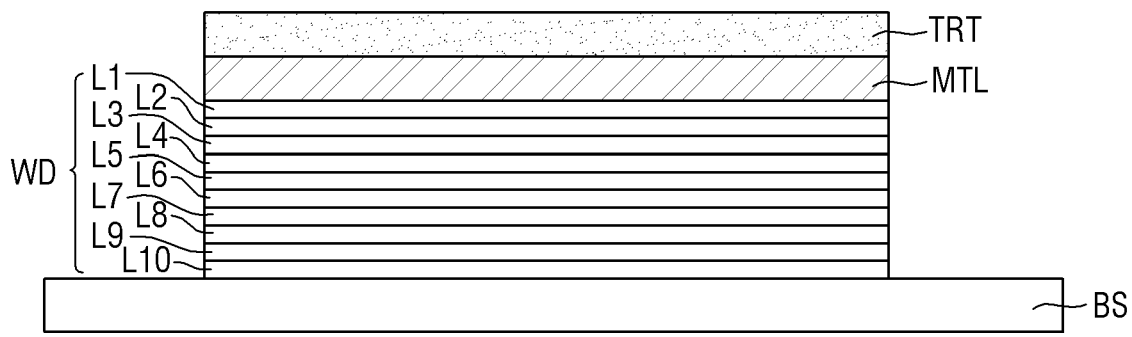
FIGS. 8-12 are side views illustrating a method of manufacturing a display device according to one or more embodiments.

First, referring to FIG. 8, a two-dimensional material member WD is disposed on a stage BS. The two-dimensional material member WD may include a multi-layer structure, and each layer may be made of a single layer of a two-dimensional material. Although it is illustrated in the drawing that the two-dimensional material member WD includes a multi-layer structure of first to tenth layers L1 to L10, the present disclosure is not limited thereto. The layers L1 to L10 of the two-dimensional material member WD may be coupled to each other by Van der Waals interaction (e.g., Van der Waals forces).

A metal layer MTL may be disposed on the two-dimensional material member WD. The metal layer MTL may be formed by depositing a metal on the two-dimensional material member WD. For example, the metal layer MTL may be formed by sputtering, physical vapor deposition (PVD), chemical vapor deposition (CVD), or atomic layer deposition (ALD). The metal layer MTL may include at least one selected from gold (Au), palladium (Pd), nickel (Ni), cobalt (Co) and/or the like.

A thermal release tape TRT may be disposed on the metal layer MTL. The thermal release tape TRT may lose its adhesive strength at a certain temperature or higher, and thus may be easily removed from the metal layer MTL.

The number of layers of the two-dimensional material member WD to be exfoliated using the thermal release tape TRT may be different depending on the binding energy between the metal layer MTL and the first layer L1 of the two-dimensional material member WD and the binding energy between the layers L1 to L10 of the two-dimensional material member WD.

Figure 9:
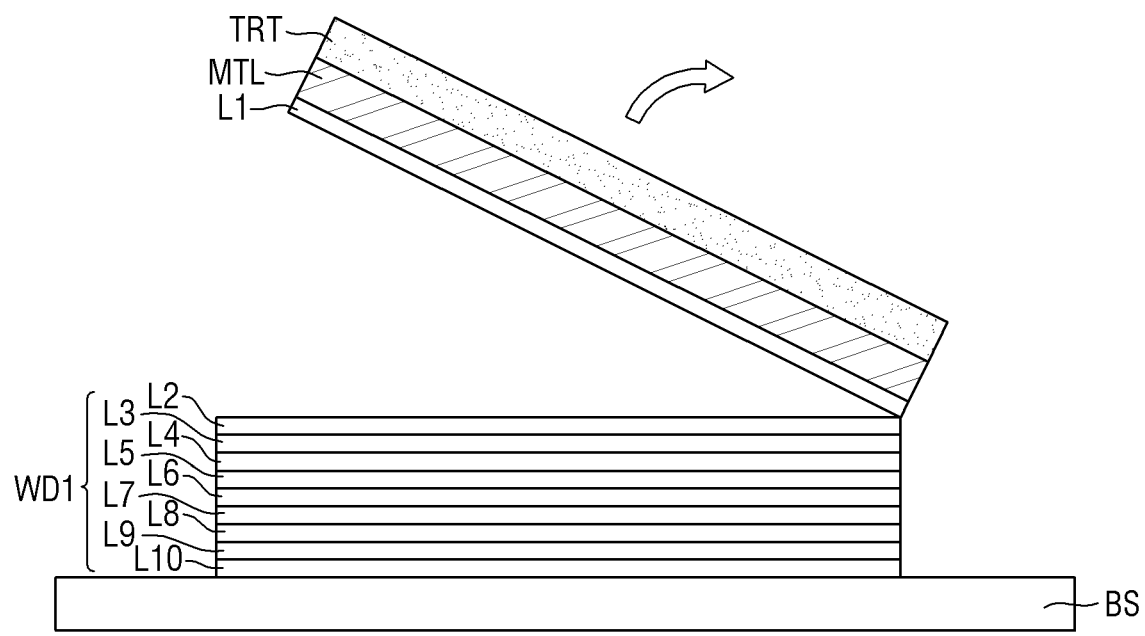

Referring to FIG. 9, when the binding energy between the metal layer MTL and the first layer L1 of the two-dimensional material member WD and the binding energy between the layers L1 to L10 of the two-dimensional material member WD are substantially the same, the number of layers of the two-dimensional material member WD to be exfoliated using the thermal release tap TRT may be one. In other words, when the binding energy between the metal layer MTL and the first layer L1 of the two-dimensional material member WD and the binding energy between the layers L1 to L10 of the two-dimensional material member WD are substantially the same, only the first layer L1 in direct contact with the metal layer MTL may be exfoliated. However, the present disclosure is not limited thereto, and only the first layer L1 in direct contact with the metal layer MTL may be exfoliated when the binding energy between the metal layer MTL and the first layer L1 of the two-dimensional material member WD is within the range of 1 to 1.5 times the binding energy between the layers L1 to L10 of the two-dimensional material member WD.

After the first layer L1 of the two-dimensional material member WD is exfoliated, the first layer L1 is moved to a target substrate. Then, the thermal release tape TRT may be removed by applying heat. After the thermal release tape TRT is removed, the metal layer MTL may be removed by etching.

After the first layer L1 of the two-dimensional material member WD is exfoliated, a first residual member WD1 may remain on the stage BS. The first residual member WD1 may include a multi-layer structure of the second to tenth layers L2 to L10.

When the metal layer MTL is deposited on the two-dimensional material member WD, internal stress may be generated between the two-dimensional material member WD and the metal layer MTL. Accordingly, tensile stress may be applied to the first layer L1 of the two-dimensional material member WD in direct contact with the metal layer MTL, and the first layer L1 of the two-dimensional material member WD may be deformed. Accordingly, the first layer L1 of the two-dimensional material member WD may have the same strain as that described with reference to FIG. 7.

Figure 10:
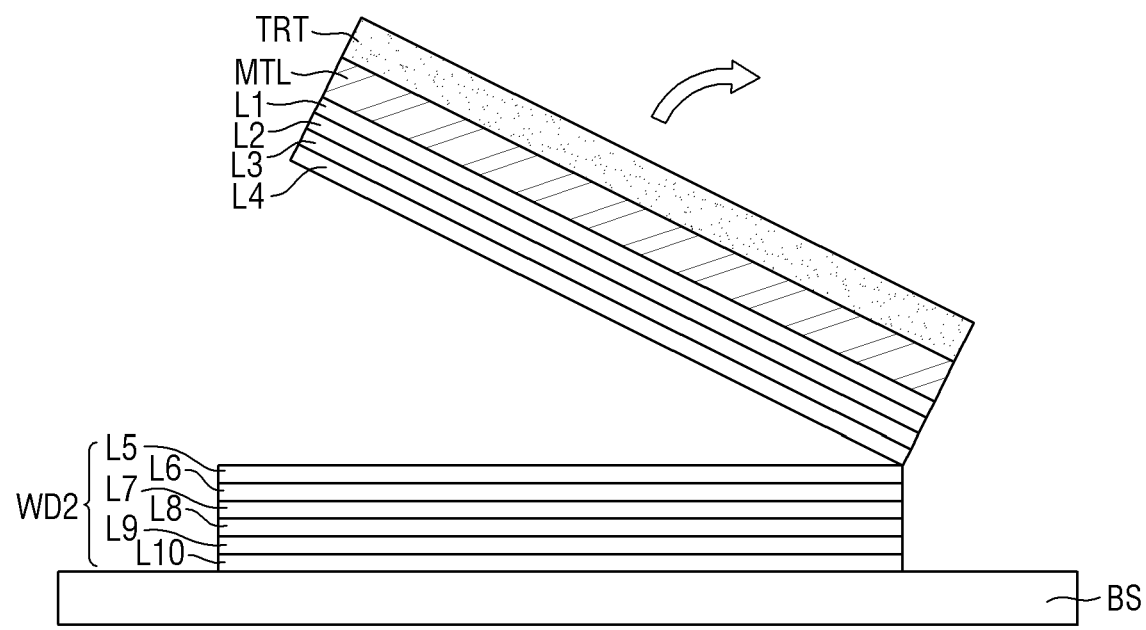

Referring to FIG. 10, when the binding energy between the metal layer MTL and the first layer L1 of the two-dimensional material member WD exceeds the binding energy between the layers L1 to L10 of the two-dimensional material member WD by 1.5 times or more, two or more layers of the two-dimensional material member WD may be exfoliated. Although it is illustrated in the drawing that the first to fourth layers L1 to L4 are exfoliated, the present disclosure is not limited thereto, and the number of layers of the two-dimensional material member WD to be exfoliated may vary depending on the binding energy between the metal layer MTL and the first layer L1 of the two-dimensional material member WD and the binding energy between the layers L1 to L10 of the two-dimensional material member WD. For example, the number of layers of the two-dimensional material member WD to be exfoliated may increase as the binding energy between the metal layer MTL and the first layer L1 of the two-dimensional material member WD with respect to the binding energy between the layers L1 to L10 of the two-dimensional material member WD increase.

After the first to fourth layers L1 to L4 of the two-dimensional material member WD are exfoliated, a second residual member WD2 may remain on the stage BS. The second residual member WD2 may include the multi-layer structure of the fifth to tenth layers L5 to L10.

Therefore, by changing the metal contained in the metal layer MTL, it is possible to control the binding energy between the first layer L1 of the two-dimensional material member WD and the metal layer MTL and also possible to control the number of layers of the two-dimensional material to be exfoliated from the 2D material member WD. Further, by changing the metal contained in the metal layer MTL depending on the two-dimensional material of the 2D material member WD, it is possible to exfoliate the two-dimensional material from the two-dimensional material member WD regardless of the type of the two-dimensional material and, further, it is possible to control the number of layers of the two-dimensional material to be exfoliated from the two-dimensional material member WD regardless of the type of the two-dimensional material.

Further, the two-dimensional material may be repeatedly exfoliated from the two-dimensional material member WD. In other words, even if a portion of the multi-layer structure of the two-dimensional material member WD is exfoliated, the two-dimensional material may be exfoliated again due to the residual members WD1 and/or WD2.

Figure 11:
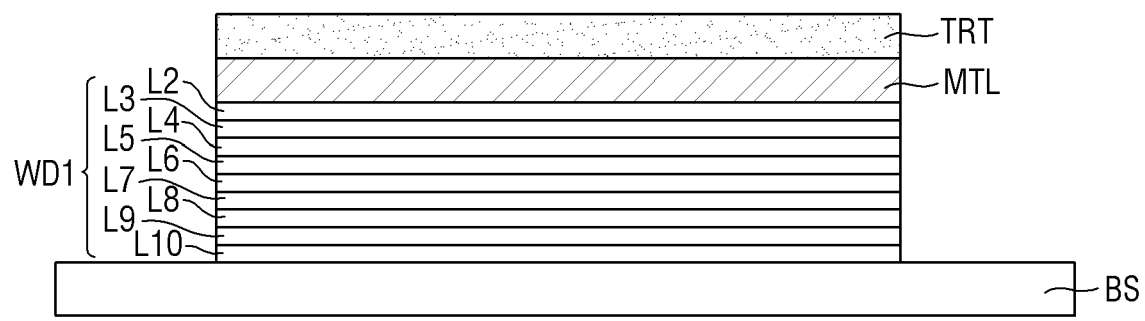
Figure 12:
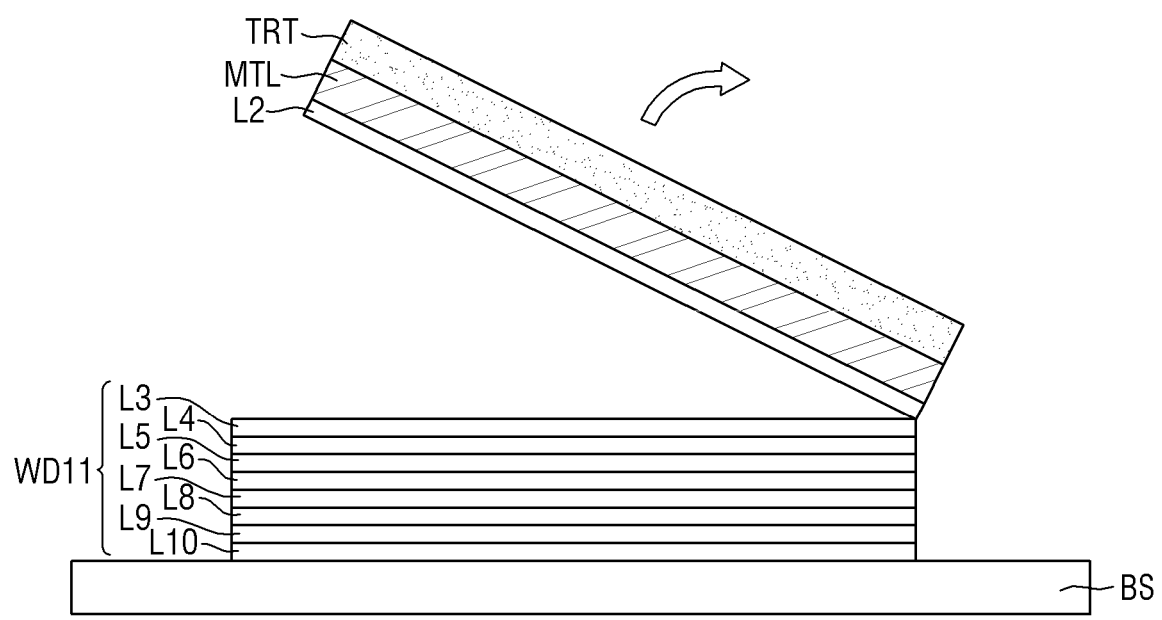

Referring to FIGS. 11 and 12, the metal layer MTL and the thermal release tape TRT are sequentially arranged on the first residual member WD1 from which the first layer L1 is removed. The metal layer MTL may be in direct contact with the second layer L2 of the first residual member WD1. In this case, when the binding energy between the metal layer MTL and the second layer L2 of the first residual member WD1 is within the range of 1 to 1.5 times the binding energy between the layers L2 to L10 of the first residual member WD1, only the second layer L2 in direct contact with the metal layer MTL may be exfoliated.

Further, when the binding energy between the metal layer MTL and the second layer L2 of the first residual member WD1 exceeds the binding energy between the layers L2 to L10 of the first residual member WD1 by 1.5 times or more, two or more layers of the first residual member WD1 may be exfoliated.

That is, in the case of exfoliating the two-dimensional material from the two-dimensional material member WD using the metal layer MTL and the thermal release tape TRT, it is possible to repeatedly use the two-dimensional material member WD. Accordingly, it is possible to simplify the process of exfoliating the two-dimensional material and to reduce the cost of the process.

Figure 13:
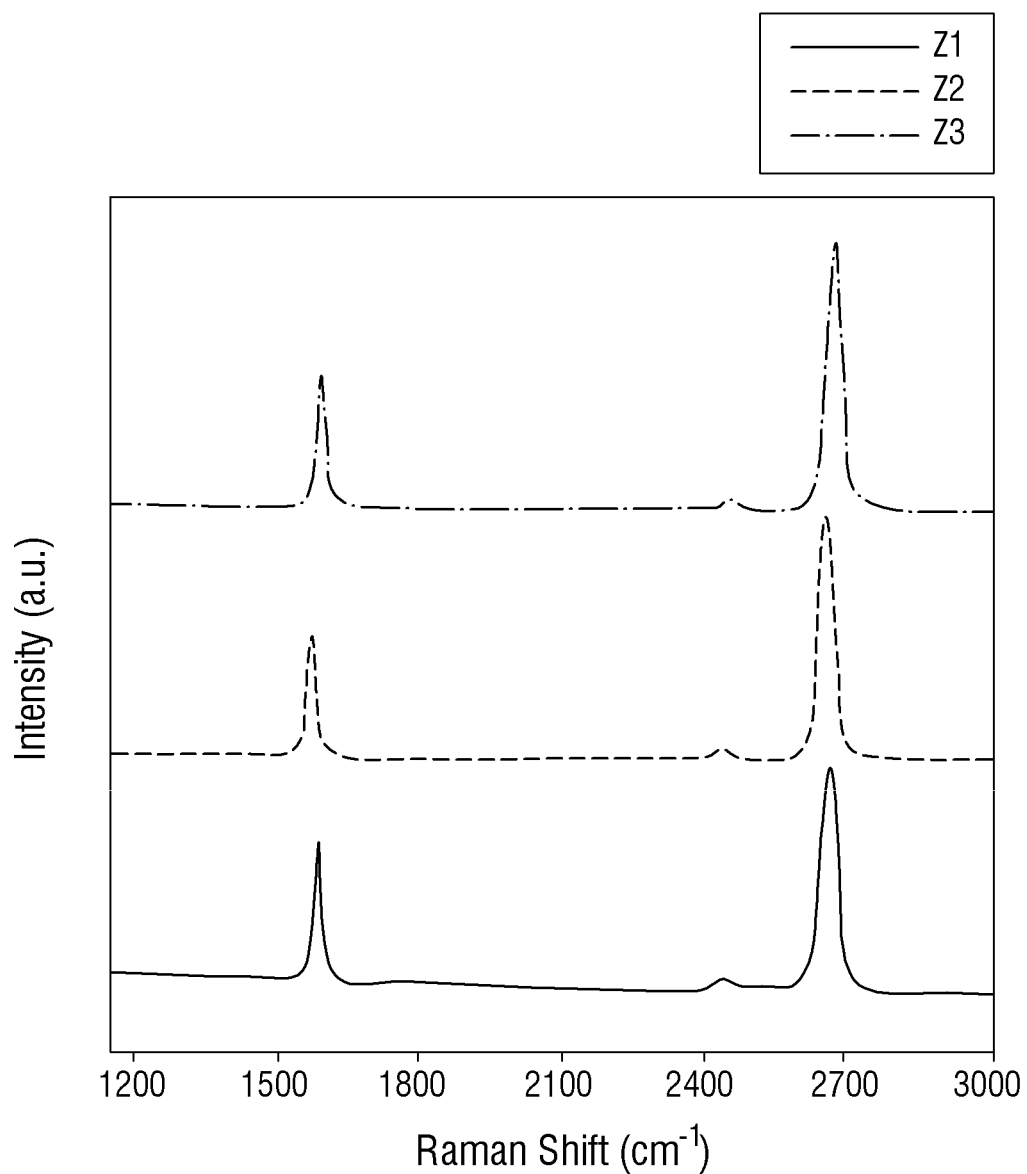
FIG. 13 shows Raman spectra of graphene repeatedly exfoliated based on the display device manufacturing method according to one or more embodiments.

FIG. 13 shows Raman spectra of graphene repeatedly exfoliated based on the display device manufacturing method according to one or more embodiments.

In FIG. 13, the horizontal axis (X-axis) represents a Raman shift ($cm^{-1}$), and the vertical axis (Y-axis) represents an intensity (a.u.). Z1 indicates a first graphene exfoliated first from the two-dimensional material member, Z2 indicates a second graphene exfoliated from the two-dimensional material member from which the first graphene is exfoliated, and Z3 indicates a third graphene exfoliated from the two-dimensional material member from which the first graphene and the second graphene are exfoliated. In the graphs of Z1 to Z3, the peaks located on the right side indicate the 2D-peaks, and the peaks located on the left side indicate the G-peaks.

Referring further to FIG. 13, the intensity of the G-peak and the intensity of the 2D-peak in each of Z1 to Z3 are substantially the same. In other words, even if the two-dimensional material is repeatedly exfoliated from one two-dimensional material member WD, the characteristics of the two-dimensional material in each exfoliated layer may be maintained without changes.

In the graph of Z1, the ratio of the 2D-peak intensity with respect to the G-peak intensity is about 1.94. In the Z2 graph, the ratio of the 2D-peak intensity with respect to the G-peak intensity is about 2.03. In the Z3 graph, the ratio of the 2D-peak intensity with respect to the G-peak intensity is about 2.07. When the ratio of the 2D-peak intensity with respect to the G-peak intensity is within the range of about 1.5 to 2.7 or within the range of about 1.8 to 2.2, the exfoliated graphene may be determined as a non-defective product. In other words, in the case of exfoliating the two-dimensional materials from the two-dimensional material member WD using the metal layer MTL and the thermal release tape TRT, even if the two-dimensional materials are exfoliated from the same two-dimensional material member WD, the exfoliated two-dimensional materials may be non-defective products.

Hereinafter, other embodiments will be described. In the following embodiments, a description of the same components as those of the above-described embodiment may not be repeated or may be simplified, and differences may be primarily described.

Figure 14:
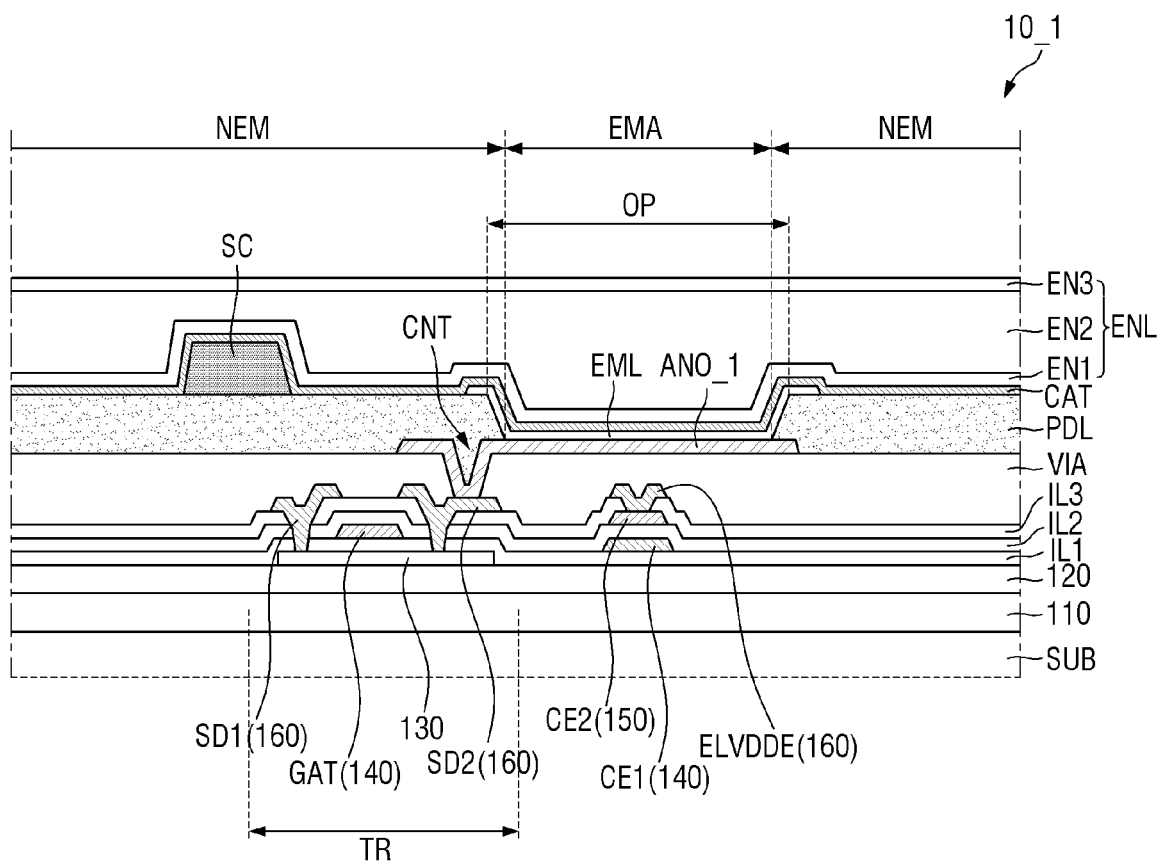
FIG. 14 is a cross-sectional view of a display panel according to another embodiment.
Figure 15:
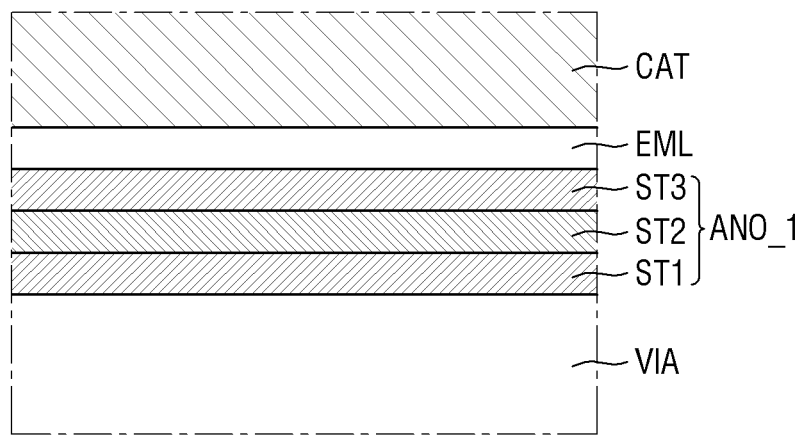
FIG. 15 is an enlarged view of a neighboring area of an anode electrode ANO_1 of FIG. 14.

FIG. 14 is a cross-sectional view of a display panel according to another embodiment. FIG. 15 is an enlarged view of a neighboring area of an anode electrode ANO_1 of FIG. 14.

Referring to FIGS. 14 and 15, the anode electrode ANO_1 of a display panel 10_1 of the present embodiment is different from the embodiment of FIG. 4 in that a two-dimensional material may be included.

Specifically, the anode electrode ANO_1 may include a first stacked conductive layer ST1, a second stacked conductive layer ST2, and a third stacked conductive layer ST3 that are sequentially stacked. At least one of the first stacked conductive layer ST1 or the third stacked conductive layer ST3 may include a two-dimensional material, and the second stacked conductive layer ST2 may include silver (Ag). When any one of the first stacked conductive layer ST1 and the third stacked conductive layer ST3 includes a two-dimensional material, the other one may contain, but not necessarily contain, indium-tin-oxide (ITO). In the present embodiment, graphene is described as the two-dimensional material included in at least one of the first stacked conductive layer ST1 or the third stacked conductive layer ST3, but the present disclosure is not limited thereto.

Although it is described that at least one of the first encapsulation layer EN1 or the third encapsulation layer EN3 of the encapsulation layer EN and the anode electrode ANO_1 include the two-dimensional material in the display panel 10_1 of the present embodiment, the present disclosure is not limited thereto, and only the anode electrode ANO_1 may include the two-dimensional material. In one or more embodiments, the two-dimensional material of the anode electrode ANO_1 may have the same or similar G-peak and 2D-peak ranges as the two-dimensional material of the encapsulation layer EN, and therefore, a redundant description thereof may not be repeated.

Figure 16:
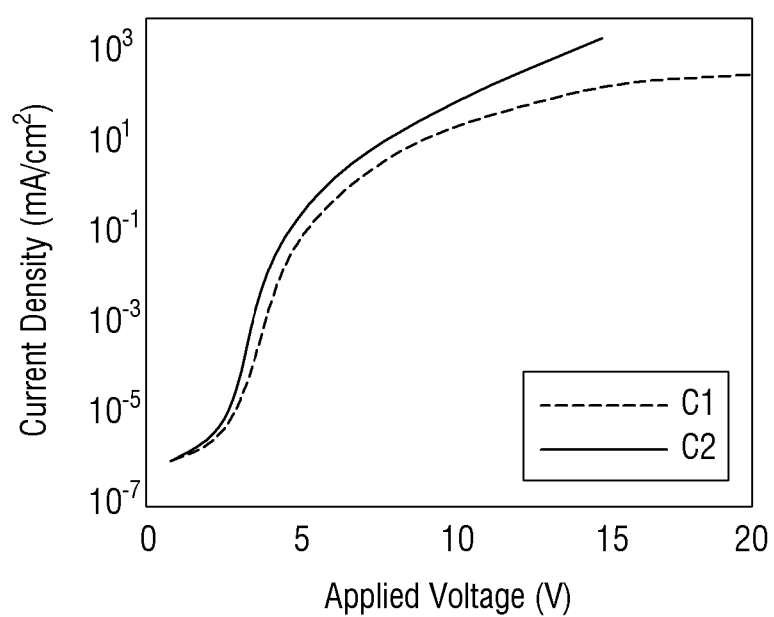
FIG. 16 is a graph showing a current density (mA/cm$^2$) with respect to a voltage (V) applied to an anode electrode according to another embodiment.

FIG. 16 is a graph showing a current density (mA/cm$^2$) with respect to a voltage (V) applied to an anode electrode according to another embodiment. In FIG. 16, the horizontal axis represents an applied voltage and the vertical axis represents a current density.

Referring further to FIG. 16, C1 indicates the case where the first stacked conductive layer ST1 and the third stacked conductive layer ST3 of the anode electrode ANO_1 include graphene, and C2 indicates the case where the first stacked conductive layer ST1 and the third stacked conductive layer ST3 of the anode electrode ANO_1 include indium-tin-oxide (ITO).

When comparing the cases C1 and C2, the current density with respect to the applied voltage exhibits substantially the same trend or tendency in both cases of C1 and C2, and the magnitude of the current density with respect to the applied voltage is also substantially the same in both cases of C1 and C2. In other words, the current density with respect to the applied voltage exhibits substantially the same tendency between when the first stacked conductive layer ST1 and the third stacked conductive layer ST3 of the anode electrode ANO_1 include graphene and when the first stacked conductive layer ST1 and the third stacked conductive layer ST3 include indium-tin-oxide (ITO). That is, even if the first stacked conductive layer ST1 and the third stacked conductive layer ST3 of the anode electrode ANO_1 includes graphene, the anode electrode ANO_1 may operate normally.

Figure 17:
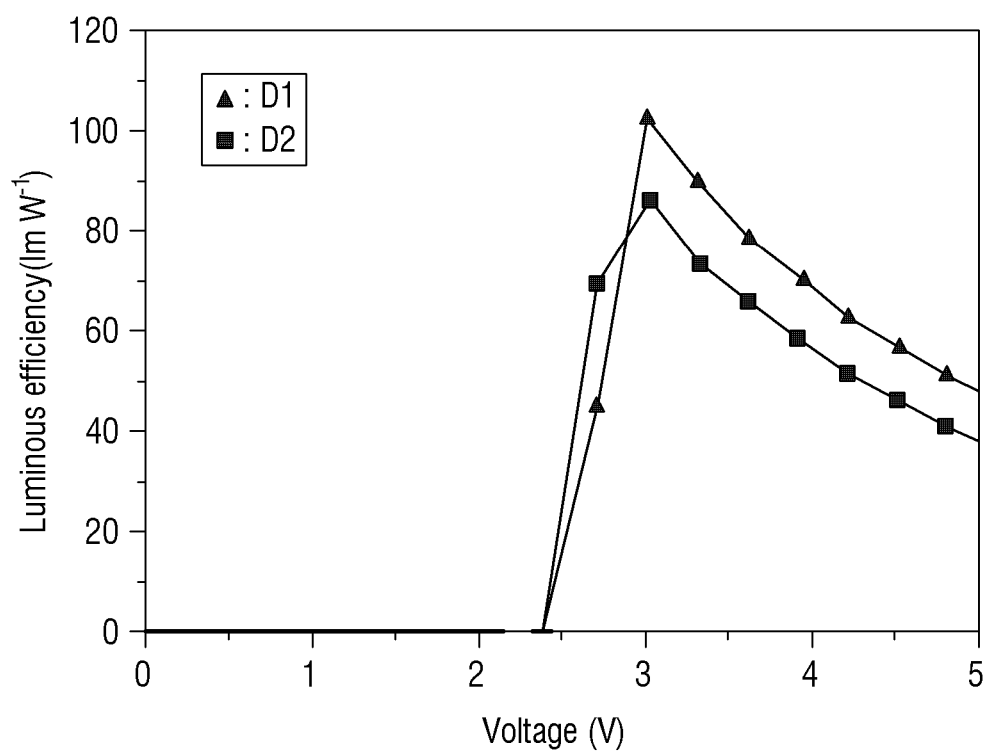
FIG. 17 is a graph showing luminous efficiency (lmW$^{-1}$) with respect to a voltage (V) applied to an anode electrode of another embodiment.

FIG. 17 is a graph showing luminous efficiency (lmW$^{-1}$) with respect to a voltage (V) applied to an anode electrode of another embodiment. In FIG. 16, the horizontal axis represents a voltage and the vertical axis represents luminous efficiency.

Referring further to FIG. 17, D1 indicates the case where the first stacked conductive layer ST1 and the third stacked conductive layer ST3 of the anode electrode ANO_1 include four layers of graphene, and D2 indicates the case where the first stacked conductive layer ST1 and the third stacked conductive layer ST3 of the anode electrode ANO_1 include indium-tin-oxide (ITO). The graphene is a graphene doped with nitric acid (HNO$_3$), but is not limited thereto.

When comparing the cases D1 and D2, the luminous efficiency with respect to the applied voltage may have substantially the same tendency in both cases of D1 and D2. When the applied voltage exceeds about 2.3V, light is emitted by the organic light emitting element in both cases of D1 and D2. When the applied voltage exceeds about 3V, the luminous efficiency is higher in the case of D1 than in the case of D2. In other words, the luminous efficiency with respect to the voltage shows that, even if the first stacked conductive layer ST1 and the third stacked conductive layer ST3 of the anode electrode ANO_1 include graphene, the anode electrode ANO_1 may operate normally and the luminous efficiency may be improved.

Figure 18:
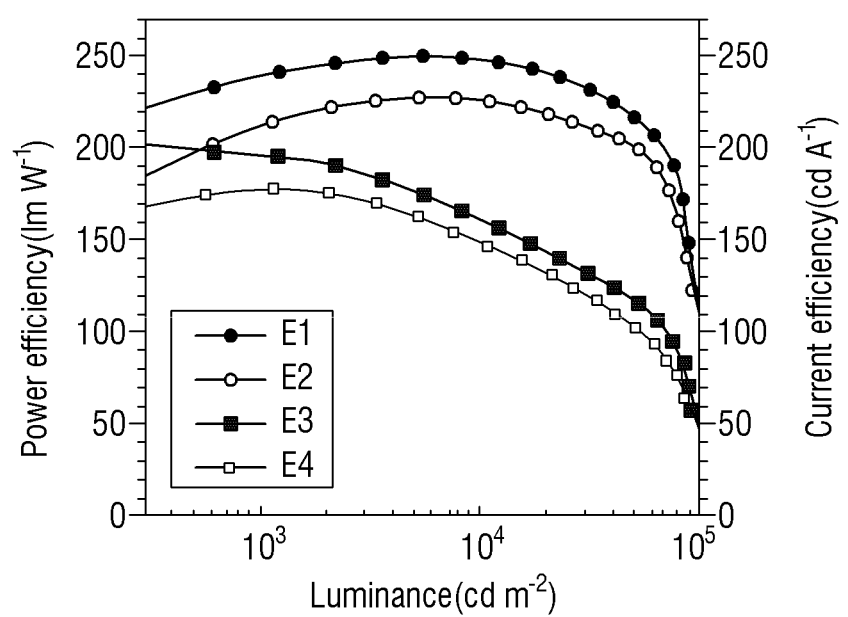
FIG. 18 is a graph showing power efficiency (lmW$^{-1}$) and current efficiency (cdA$^{-1}$) of an anode electrode with respect to luminance (cdm$^{-2}$)

FIG. 18 is a graph showing power efficiency (lmW$^{-1}$) and current efficiency (cdA$^{-1}$) of an anode electrode with respect to luminance (cdm$^{-2}$). In FIG. 18, the horizontal axis represents luminance, and the vertical axis represents current efficiency and power efficiency.

Referring further to FIG. 18, E1 indicates the current efficiency in the case where the first stacked conductive layer ST1 and the third stacked conductive layer ST3 of the anode electrode ANO_1 include a single layer of graphene, E2 indicates the current efficiency in the case where the first stacked conductive layer ST1 and the third stacked conductive layer ST3 of the anode electrode ANO_1 include indium-tin-oxide (ITO), E3 indicates the power efficiency in the case where the first stacked conductive layer ST1 and the third stacked conductive layer ST3 of the anode electrode ANO_1 include a single layer of graphene, and E4 indicates the power efficiency in the case where the first stacked conductive layer ST1 and the third stacked conductive layer ST3 of the anode electrode ANO_1 include indium-tin-oxide (ITO).

When comparing current efficiency in the cases E1 and E2, the current efficiency with respect to the luminance has substantially similar tendency in both cases of E1 and E2, and the current efficiency may be higher in the case of E1 than in the case of E2. When comparing power efficiency in the cases E3 and E4, the power efficiency with respect to the luminance has substantially similar tendency in both cases of E3 and E4, and the power efficiency may be higher in the case of E3 than in the case of E4. In other words, the current efficiency and the power efficiency are higher when the first stacked conductive layer ST1 and the third stacked conductive layer ST3 of the anode electrode ANO_1 include graphene than when the first stacked conductive layer ST1 and the third stacked conductive layer ST3 of the anode electrode ANO_1 include indium-tin-oxide (ITO).

Therefore, when the first stacked conductive layer ST1 and the third stacked conductive layer ST3 of the anode electrode ANO_1 include graphene, the anode electrode ANO_1 operates normally and the luminous efficiency is improved. Also, the manufacturing cost of the display device 1 (e.g., see FIG. 1) may be relatively reduced. Further, in this case as well, the two-dimensional material of the anode electrode ANO_1 may be exfoliated by the metal layer MTL (e.g., see FIG. 8) and the thermal release tape TRT (e.g., see FIG. 8), and the cost of the process of exfoliating the two-dimensional material may be reduced. Also, the number of layers of the two-dimensional material to be exfoliated may be controlled.

Figure 19:
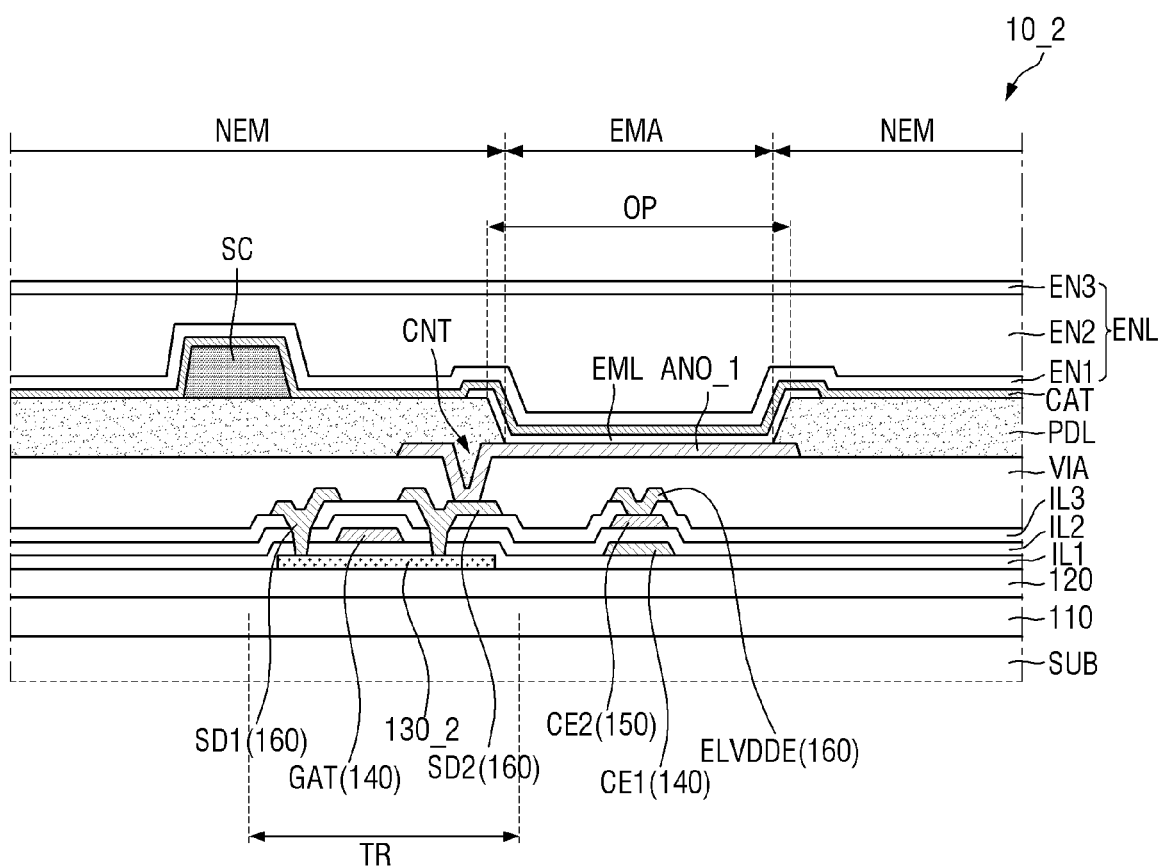
FIG. 19 is a cross-sectional view of a display panel according to still another embodiment.

FIG. 19 is a cross-sectional view of a display panel according to still another embodiment.

Referring to FIG. 19, an active layer 130_2 of a display panel 10_2 of the present embodiment may include a two-dimensional material.

Specifically, the active layer 130_2 of the display panel 10_2 may include a two-dimensional material. The two-dimensional material may include, but not necessarily include, transition metal dichalogenides (TMDC). The transition metal dichalogenides (TMDC) may be expressed by the chemical formula of $MX_2$. In the above chemical formula, M may be any one selected among Mo, W, Zr, and Re, and X may be any one selected among S, Se, and Te. In one example, the above chemical formula may be expressed as $MoS_2$, $WSe_2$, or the like. In other words, the channel region of the transistor TR of the display panel 10_2 may include a two-dimensional material.

Although it is described that at least one of the first encapsulation layer EN1 or the third encapsulation layer EN3 of the encapsulation layer EN and the active layer 130_2 include a two-dimensional material in the display panel 10_2 of the present embodiment, the present disclosure is not limited thereto, and only the active layer 130_2 may include a two-dimensional material.

Figure 20:
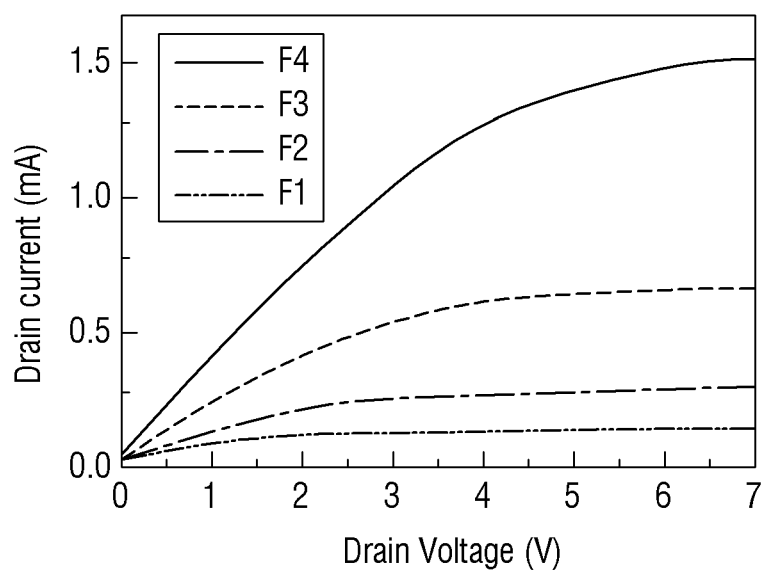
FIG. 20 is a graph showing a drain current (mA) with respect to a drain voltage (V) of the transistor according to the embodiment of FIG. 19.

FIG. 20 is a graph showing a drain current (mA) with respect to a drain voltage (V) of the transistor according to the embodiment of FIG. 19. FIG. 20 shows a case where the transistor TR is an NMOS transistor. In FIG. 20, F1 indicates the case where a gate-source voltage is 4V, F2 indicates the case where the gate-source voltage is 5V, F3 indicates the case where the gate-source voltage is 6V, and F4 indicates the case where the gate-source voltage is 7V.

Referring further to FIG. 20, in each of the graphs (e.g., see cases F1 to F4), as the drain voltage of the transistor TR increases, the drain current tends to be gradually increased and saturated. The drain current of the transistor TR increases as the gate-source voltage increases, and may be saturated at a high value.

Figure 21:
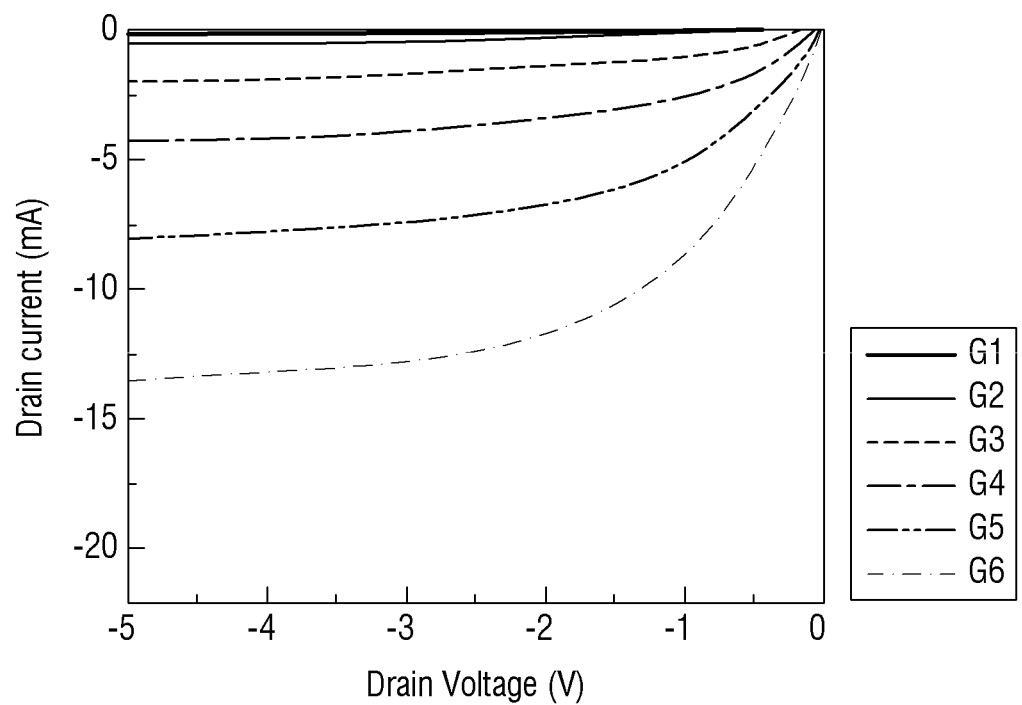
FIG. 21 is a graph showing a drain current (mA) with respect to a drain voltage (V) of the transistor according to the embodiment of FIG. 19.

FIG. 21 is a graph showing a drain current (mA) with respect to a drain voltage (V) of the transistor according to the embodiment of FIG. 19. FIG. 21 shows the case where the transistor TR is a PMOS transistor. In FIG. 21, G1 indicates the case where the gate-source voltage is 0V, G2 indicates the case where the gate-source voltage is −1V, G3 indicates the case where the gate-source voltage is −2V, G4 indicates the case where the gate-source voltage is −3V, G5 indicates the case where the gate-source voltage is −4V, and G6 indicates the case where the gate-source voltage is −5V.

Referring further to FIG. 21, in each of the graphs (e.g., see cases G1 to G6), as the drain voltage of the transistor TR decreases, the drain current tends to be gradually decreased and saturated. The drain current of the transistor TR increases as the gate-source voltage decreases, and may be saturated at a low value.

Therefore, even if the active layer 130_2 of the transistor TR includes a two-dimensional material, the transistor TR may operate normally. Further, in this case as well, the two-dimensional material of the active layer 130_2 may be exfoliated by the metal layer MTL (e.g., see FIG. 8) and the thermal release tape TRT (e.g., see FIG. 8), and the cost of the process of exfoliating the two-dimensional material may be reduced. Also, the number of layers of the two-dimensional material to be exfoliated may be controlled.

While the present disclosure has been particularly shown and described with reference to some example embodiments thereof, it will be understood by those of ordinary skill in the art that various changes in form and details may be made therein without departing from the spirit and scope of the present disclosure as set forth in the following claims, and their equivalents. Therefore, the disclosed embodiments of the present disclosure are used in a generic and descriptive sense only and not for purposes of limitation.

What is claimed is:

1. A display device comprising:
   a substrate;
   a first electrode on the substrate;
   a pixel defining layer on the first electrode, the pixel defining layer exposing the first electrode;
   a light emitting layer on the first electrode exposed by the pixel defining layer;
   a second electrode on the light emitting layer; and
   an encapsulation layer on the second electrode, the encapsulation layer comprising a first encapsulation layer, a second encapsulation layer, and a third encapsulation layer that are sequentially stacked, and at least one of the first encapsulation layer or the third encapsulation layer comprising a two-dimensional material,
   wherein a slope of a 2D-peak position to a G-peak position of the two-dimensional material measured by Raman spectroscopy is within a range of 1.7 to 2.7;
   wherein the two-dimensional material comprises at least one exfoliated layer;
   wherein the second encapsulation layer comprises an organic material; and
   wherein the first encapsulation layer and the third encapsulation layer are in contact with each other at an end portion of the encapsulation layer to seal the second encapsulation layer.

2. The display device of claim 1, wherein the 2D-peak position of the two-dimensional material measured by Raman spectroscopy is within a range of 2650 $cm^{-1}$ to 2675 $cm^{-1}$.

3. The display device of claim 2, wherein the G-peak position of the two-dimensional material measured by Raman spectroscopy is within a range of 1575 $cm^{-1}$ to 1585.5 $cm^{-1}$.

4. The display device of claim 1, wherein the two-dimensional material of the encapsulation layer is graphene.

5. The display device of claim 1, wherein the first electrode comprises a two-dimensional material.

6. The display device of claim 5, wherein the first electrode comprises a first stacked conductive layer, a second stacked conductive layer, and a third stacked conductive layer that are sequentially stacked, and
   wherein the first stacked conductive layer and the third stacked conductive layer comprise the two-dimensional material of the first electrode.

7. The display device of claim 6, wherein the two-dimensional material of the first electrode is graphene.

8. The display device of claim 1, further comprising a thin film transistor electrically connected to the first electrode,
   wherein a channel region of the thin film transistor comprises a two-dimensional material.

9. The display device of claim 8, wherein the two-dimensional material of the thin film transistor comprises transition metal dichalcogenides (TMDC).

10. The display device of claim 1, wherein the at least one exfoliated layer comprises graphene.

11. The display device of claim 1, wherein the first encapsulation layer is directly on the second electrode and comprises the two-dimensional material.

12. A display device comprising:
    a substrate;
    a first electrode on the substrate;
    a pixel defining layer on the first electrode, the pixel defining layer exposing the first electrode;
    a light emitting layer on the first electrode exposed by the pixel defining layer;
    a second electrode on the light emitting layer; and
    an encapsulation layer on the second electrode, the encapsulation layer comprising a first encapsulation layer, a second encapsulation layer, and a third encapsulation layer that are sequentially stacked, and the third encapsulation layer comprising a two-dimensional material, a touch layer to detect a touch input, the touch layer on the third encapsulation layer;

an insulating layer comprising an insulating material between the third encapsulation layer and the touch layer;

wherein a slope of a 2D-peak position to a G-peak position of the two-dimensional material measured by Raman spectroscopy is within a range of 1.7 to 2.7; and wherein the two-dimensional material comprises at least one exfoliated layer.

13. An electronic device including a display device comprising:

a substrate;

a first electrode on the substrate;

a pixel defining layer on the first electrode, the pixel defining layer exposing the first electrode;

a light emitting layer on the first electrode exposed by the pixel defining layer;

a second electrode on the light emitting layer; and an encapsulation layer on the second electrode, the encapsulation layer comprising a first encapsulation layer, a second encapsulation layer, and a third encapsulation layer that are sequentially stacked, and at least one of the first encapsulation layer or the third encapsulation layer comprising a two-dimensional material, wherein a slope of a 2D-peak position to a G-peak position of the two-dimensional material measured by Raman spectroscopy is within a range of 1.7 to 2.7;

wherein the two-dimensional material comprises at least one exfoliated layer;

wherein the second encapsulation layer comprises an organic material; and wherein the first encapsulation layer and the third encapsulation layer are in contact with each other at an end portion of the encapsulation layer to seal the second encapsulation layer.

\* \* \* \* \*